United States Patent [19]
Li

[11] Patent Number: 5,230,924
[45] Date of Patent: Jul. 27, 1993

[54] METALLIZED COATINGS ON CERAMICS FOR HIGH-TEMPERATURE USES

[76] Inventor: Chou H. Li, 379 Elm Dr., Roslyn, N.Y. 11576

[21] Appl. No.: 644,421

[22] Filed: Jan. 22, 1991

Related U.S. Application Data

[63] Continuation-in-part of Ser. No. 277,672, Dec. 14, 1988, abandoned.

[51] Int. Cl.$^5$ .................... B05D 3/02; B23K 31/00; B23K 35/22
[52] U.S. Cl. ................... 427/229; 427/376.7; 427/383.5; 427/226; 427/376.6; 427/62; 228/263.12; 228/124; 505/1
[58] Field of Search ............... 427/229, 376.7, 383.5, 427/376.6; 228/263.12, 120, 122, 124

[56] References Cited

U.S. PATENT DOCUMENTS

| | | | |
|---|---|---|---|
| 3,553,820 | 1/1971 | Sara | 427/431 |
| 3,981,429 | 9/1976 | Parker | 228/194 |
| 4,270,691 | 6/1981 | Ishii et al. | 228/194 |

FOREIGN PATENT DOCUMENTS

| | | |
|---|---|---|
| 58-181770 | 10/1983 | Japan. |
| 60-200869 | 10/1985 | Japan. |
| 60-231471 | 11/1985 | Japan. |
| 64-788 | 1/1989 | Japan. |
| 1-167291 | 6/1989 | Japan. |

OTHER PUBLICATIONS

Hashimoto et al "Thermal Expansion Coefficients of High-Tc Superconductors" Jpn. J. Appl. Phys. 27(2) Feb. 1988 L214-216.

Suga, "Current Research and Future Outlook in Japan" in Designing Interfaces for Technological Applications: Ceramic-Ceramic, Ceramic-Metal Joining, Ed. by S. D. Peters, (1989) pp. 247-263.

*Primary Examiner*—Shrive Beck
*Assistant Examiner*—Roy V. King

[57] ABSTRACT

A method for forming metallized coatings on ceramics for high-temperature uses above about 630° C. comprising the steps of: preparing a metallizing composition of mixed ingredients of differing sizes, proportioning the differing sizes to have nonsegregating qualities when applied onto the ceramics, coating the metallizing composition on the ceramics and heating to form the desired metallized layers.

49 Claims, 2 Drawing Sheets

METALLIZED COATINGS ON CERAMICS FOR HIGH-TEMPERATURE USES

REFERENCE TO RELATED APPLICATIONS

This is a continuation-in-part of my pending U.S. application Ser. No. 07/277,672, filed Dec. 14, 1988, now abandoned. I hereby incorporate by reference the above-cited reference.

FIELD

This invention relates to ceramic coating method, namely, method for coating ceramic on metal, metal on ceramic, or ceramic on ceramic; and more particularly relates to ceramic coating methods with uniform ceramic metallizing compositions and liquid diffusion formed and specially graded, substantially defect-free bonded regions to produce reproducibly strong and thermomechanically shock-resistant coatings.

By ceramic I mean not only the usual ceramics such as alumina, zirconia, beryllia, mullite; but also quartz, intermetallics, diamond, boron, graphite, carbon, silicon, and various other carbides, nitrides, aluminides, or borides; glasses, machinable glasses, Corning's Vision glass; and the surface of many metals particularly reactive metals such as aluminum, magnesium, chromium, silicon, titanium, or zirconium which always have oxides or other compounds of reactions of the metal with the environment.

PRIOR ART

Various methods have been developed to join metal to ceramics. But none gives stable, strong, and temperature resistant coatings or joints. Reliable ceramic coatings or joints are not commercially available worldwide at any cost.

Under a well-coordinated intensive effort on ceramic-metal bonding, Japan is the most successful country in the development and commercialization of products involving metal-ceramic joints. They already have been successfully: 1) used a ceramic turbocharger (NGK, Nissan), 2) produced an all ceramic swirl chamber for diesel engines (Mazda, NGK), and 3) prototyped a ceramic turbomolecular pump (Mitsubuishi and Japan Atomic Energy Research Institute), according to Prof. T. Suga of the University of Tokyo in his 1989 review paper on the "Future Outlook in Japan". But the practical useful temperature of the best Japanese ceramic joints to special "matching" metal alloys is only 600°0 C. Further, the bond strength decreases rapidly with temperature, because the reaction products in their bonded regions become weak and brittle under thermal stresses. They consider the improvement of the thermomechanical shock resistance of the joints to be an urgent task. The European effort, mainly in Germany and France, has been even less successful. Germany failed to reach their goal after the first ten-year (1974–1983) program and its follow-up in 1983–1986. Their present program (1985–1994) merely emphasizes on achieving reproducible mechanical properties and component reliability. The U.S. Department of Energy supports much of U.S. ceramic joining R&D. It also had to renew annular the ceramic automotive program after 10-year, 50-million intensive work.

Many problems exist with the present ceramic metallizing methods. A serious problem is the difficulty of achieving uniform metallized layers formed on the ceramic. Take, for example, the commonly used heavy metal processes, such as W-yttria ($W-Y_2O_3$), W-Fe, or Mo-Mn. In these and many similar joining methods, segregation of the mixed metal or other powders takes place due to their differing specific gravities, shapes, sizes, porosities, and surface smoothness. These segregations occur at all times: during the mixing of the powders, storing of the powder suspensions, application of the suspensions, settling of the suspended powder particles, and drying of the suspension. Further, these segregations occur so fast as to be practically uncontrollable, as will be shown shortly.

In general, spherical, heavy, large, smooth, and dense particles settle first and early in the binder or suspension medium. Upon settling, these particles tend to roll or move sidewise or downward toward the corners or boundaries faster and further than odd-shaped, light, small, rough, and porous particles of otherwise identical characteristics.

Take the $W-Y_2O_3$ mixed powders in an organic binder of nitrocellulose in butyl carbitol acetate with specific gravities of 19.3, 4.5, and 0.98, respectively. Such a suspension, even if perfectly mixed up by shaking, stirring, roller-milling, or otherwise, will immediately tend to segregate. More specifically, the initial settling acceleration due to gravitational minus buoyancy forces on W powders is $980.6 \times (19.3 - 0.98)/19.3 = 930.8$ cmxcm/sec, while that of $Y_2O_3$ powders is only 767.0 cmxcm/sec.

In a mixing, storing, or carrying bottle 10 cm high and containing a perfectly mixed suspension of these metallizing powders, the time to completely settle out is only 147 ms (milliseconds) for W powders, if uniform acceleration is assumed. At the tip of a paint brush having a suspension drop 0.3 cm in diameter, the complete settling time of these same W powders is merely 25.4 ms, while on a horizontally painted or sprayed layer 0.1 cm thick, the same settling time is only 14.7 ms. In all these cases, the complete settling time for the $Y_2O_3$ powders is always the square root of $930.8/767.0 = 1.21$, or 21% longer.

Note in particular that the powder segregations with uniform accelerations may be completed within 147 to 14.7 ms. Such short times indicate that the $W-Y_2O_3$ powder segregations are beyond human controls. Painted or sprayed mixed powder layers are thus always not uniform.

In metallizing onto a horizontal ceramic surface to be metallized, most of the W powders immediately settles out. The first layers are therefore always very rich in W, and correspondingly very poor in $Y_2O_3$. These first layers are too refractory for the preset metallizing temperature (up to about 1550° C.) so that the ceramic surfaces are not sufficiently metallized, or not at all. The last settling layers, on the other hand, are too rich in the fluxing $Y_2O_3$. Again, the ceramic surfaces are improperly metallized, with only a glassy layer being formed which is very weak in strength and thermal or thermal shock resistance.

Thus, common metallizing results on ceramics are often erratic and uncontrollable. The metallized surface may contain loose and unmetallized spots with high heavy refractory metal content, as well as non-wettable spots due to the high flux content. The entire process is critical and involved, and yet nonuniform. The resultant ceramic-metal joints or ceramic coatings on metals are weak, costly, nonreproducible, and usually non vacuum-tight, or temperature-resistant.

Painting or spraying onto vertical or inclined surfaces results in vertical and additional lateral segregations and gradations, and gives added poor uniformity, reproducibility, and bonding strength.

While only the effect of gravitational density segregation has been considered in some detail, the other segregation variables such as powder shape, size, porosity, and surface roughness are also important.

A second important problem with common joining processes is the lack of control, or even understanding, of dynamic mismatches of temperatures, stresses, and strain profiles in the joint region, and their variations with time. Another aspect of this invention is therefore to described such dynamic mismatch phenomena, and to specially tailor-grade the composition and/or physical property profiles of the joint region so that the maximum or critical transient mismatch stresses never exceed the local material strength at any point inside the joint region, at any time during the heating or cooling of such joints in processing or service.

A third problem results from our poor understanding of the required microstructural, chemical, and physical properties of the interfacial regions in the ceramic-metal joints.

Accordingly, an object of this invention is to provide improved ceramic-metal joints and joining methods;

A further object of this invention is to provide improved ceramic metallizing methods for these joints;

A broad object of this invention is to minimize gravitational segregations of the components in the metallizing methods during or prior to the joining;

Another broad object of the invention is to specially tailorgrade, both in and normal to the joining plane, the composition and/or property profiles in the joint regions to ensure that the maximum dynamic or transient stresses do not exceed the local material strengths at any point and time;

A further object of the invention is to provide a specially microengineered interfacial region of the optimum characteristics to achieve defect-free, tough, and very strong joints;

Another object of the invention is to flawlessly coat metals or ceramics with protective materials;

A yet another object of the invention is to provide substantially flawlessly coated reinforcements for the manufacture of tough, strong, thermochemically stable, and thermomechanically shock-resistant composites;

Further objects and advantages of my invention will appears as the specification proceeds.

SUMMARY

A method for improving the strength of a ceramic-metal bond comprising: providing a uniform metallizing composition; and forming by liquid diffusion between the ceramic and metal a shock-absorbing, interfacial region whose microstructure is free of voids, inclusions, microcracks, and excessive dynamic mismatch stresses/strains and stress gradients.

BRIEF DESCRIPTION

The invention and its further objects and features will be more clearly understood from the following detailed description taken in conjunction with the drawings in which.

DETAILED DESCRIPTION

Figure 1:
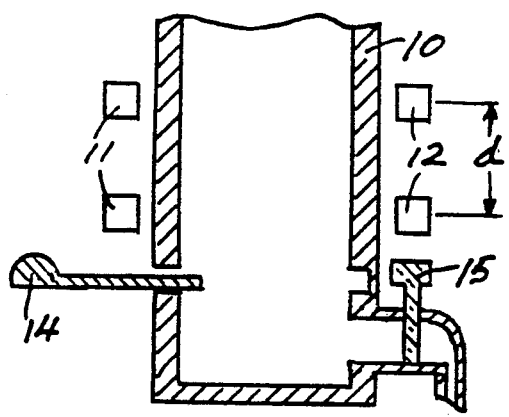
FIG. 1 shows a system for real-time monitoring of mixed settling powders.

It will be understood that the specific embodiments described herein are merely illustrative of the general principles of the invention and that various modifications are feasible without departing from the spirit and scope of the invention. That is, the invention is of general applicability for improving the quality of the ceramic-metal joints or joining methods, or coatings of ceramics on ceramics, or on metals. It is also evident that materials, structures, and methods other than those especially described can be used to practice the invention.

Stokes in 1851 first considered the resistance R which a fluid medium of density $d_m$ and viscosity n offers to the movement of a spherical particle of velocity V diameter D and density $d_p$ suspended in it, and arrived at the equation $R = 3 \pi D v n$.

The small sphere settling in the fluid (i.e., gaseous or liquid) suspension medium is acted on by the force of gravity with gravitational constant g, $\pi D^3 d_p g/6$ acting downward; and by the buoyant force of the fluid, $\pi D^3 d_m g/6$, given by Archimedes' principle and acting upward. The resultant net gravitational force G is $\pi D^3 (d_p - d_m) g/6$ acting downward, producing a downward acceleration, a.

When the resistance R exactly equals this net gravitational force G, the acceleration reduces to zero; the final velocity $v_f$, becomes constant. There then results:

$$3\pi D n v_f = \pi D^3 (d_p - d_m) g/6$$

Hence, the final velocity is: $v_f = (d_p - d_m) g D^2 / 18 \, n$, the equation of Stokes' law which has been shown to be widely valid.

For a given fluid density $(d_m)$ at a specific temperature (viscosity n) and a given sphere (of density $d_p$ and mass M), the Stokes' equation gives a velocity constant:

$$v_c = v_f / D^2 = (d_p - d_m) g / 18 \, n$$

Also, the velocity at any time starting from rest, t, is:

$$v = (1 - \exp(-Rt/M)) \times v_f$$

while the settling distance at time t is:

$$s_t = (t - (1 - \exp(-Rt/M)) \times M/R) \times G/R$$

The velocity equation shows that the exact $v_f$ is not reached until after infinitely long time when the exponential term in the equation turns to zero and then the velocity reduces to $v = v_f$, as it should.

With the Stokes' law, one can calculate the velocity constants, $v_c$ in 1/cm-sec, for the settling in water at 20° C. ($d_m = 1.0$ and $n = 0.010$) of various metal or oxide powders, with densities in g/cc in parentheses, as follows: W (19.35) 100,000, $Y_2O_3$ (5.01) 21,900, Fe (7.87), 37,400, Mo (10.2) 50,100, Mn (7.2) 33,800, $WO_3$ (7.16) 33,600, $Fe_2O_3$ (5.24) 23,100, $MoO_3$ (4.692) 20,100, and $MnO_2$ (5.026) 21,900.

Thus, in the W—$Y_2O_3$ metallizing process, because the W powders are 3.9 (19.35./5.01) times heavier than $Y_2O_3$, the velocity constants $v_c$'s of the two components differ by a factor of 100,000/21,900 = 4.6 times. That is, for a given powder size D, the final constant settling velocity $v_f$ of W spheres is 4.6 times greater than that of $Y_2O_3$ spheres. As discussed above, this wide difference in velocities results in severe gravitational segregation and early depletion of W particles in the settling mixtures and, therefore, poor metallizing results.

It can also be seen that the powders in the mixed oxide processes, e.g., $WO_3$-$Fe_2O_3$, are much more uniform, or less varying, in densities, $d_p$, than mixed particles of the same metals, e.g., W-Fe. Thus, the $WO_3$-$Fe_2O_3$ process shows density and velocity constant ratios of 1.366 and 1.455, vs 2.459 and 2.674, respectively, for the W-Fe process.

Similarly, in the Mo-Mn process, replacing the metal powders by their respective oxides reduces the differences in the ratios of velocity constants, $v_c$, and final velocities, $v_f$, from 48.2% to only 9.0% and 19.2% to 4.2%, respectively. In addition, the metal particles, i.e., W, Fe, Mo, and Mn when reduced during metallizing from their respective oxides are smaller than the initial oxide powders. These smaller sizes further promote homogenizations and metallizing results.

Hence, if we select and mix the $WO_3$ and $Fe_2O_3$ spherical powders in the size (diameter D) ratio of the square root of (33,600/23,100 = 1.455), i.e., 1.206, the final settling velocities of both these size-ratioed powders will be exactly the same. That is, by simply making the $Fe_2O_3$ powders 20.6% larger than the $WO_3$ powders, the mixed particles will finally settle in water at 20° C. at exactly the same velocity. This condition leads to metallizing uniformity due to the uniform composition of the finally deposited layers.

The final settling velocities of the two mixed powders, $v_s$'s, however, come only after some settling time, $t_s$, when a specific amount, Q, of the mixed powders has already settled out at differing velocities. From this settling time, $t_s$, for the specific combination of component powders, the settled amount Q and material use efficiency can be computed from the materials remaining after the settling time, $t_s$. The materials already settled before $t_s$ is the presettled distances, $s_t$, multiplied by the initial material densities. But the already settled materials are not lost, since they can be recirculated and reused in subsequent metallizing runs.

In this way, gravitational segregations between, for example, cosettling W and Fe, Mo and Mn, $WO_3$ and $Fe_2O_3$, or $MoO_3$ and $MnO_2$ powders, are minimized. Naturally, the smaller the percentage of velocity or useful powder size differences, $\Delta v$ and $\Delta D$ respectively, the lower the material use efficiency on a particular mixed-powder combination. An engineering compromise must, therefore, be struck.

It can be seen that the fluid suspension medium may be either a gaseous or liquid medium. The liquid may be water, alcohol, other inorganic or organic liquid of fairly constant viscosity at room temperature. A varying viscosity liquid may also be used, for example, a polymerizing organic substance containing a polymer and a hardener, a nitrocellulose in an evaporating solvent such as butyl carbitol acetate, or Duco cement diluted with rapidly evaporating acetone, to achieve rapidly increasing viscosity, n. The velocity constant of the settling powders is, as shown above, inversely proportional to this viscosity. In all cases, the starting time for achieving nearly equal settling velocities is shortened by the increasing viscosity due to polymerization or solvent evaporation. With increasing viscosities, the absolute difference in centimeters per second between the settling velocities of the two mixed powders of differing densities then become less, and nearly equal settling conditions are more easily achieved. The real-time monitoring system to be described in FIG. 1 is also useful, but the nearly equally settling mixed powders must be quickly used before much further polymerization or evaporation takes place.

Apparently, the above technique for minimizing gravitational segregation through minimized settling differences can be used to handle more than two types of powders of differing densities.

In practice, we specify that the two settling velocities of the mixed particles are within a certain prespecified percentage, e.g., 20 or 10%, of each other. Still, gravitational segregations are minimized.

By repeated iteration or computer simulation, the best mixed-powder metallizing process for optimal combined metallizing uniformity and material use efficiency can be systematically determined. Based on these principles, method and equipment can be developed for controlling the turn-on time for starting to deposit the mixed powder at nearly equal final settling velocity, $v_f$, into metallizing layers with the size-ratioed powders.

FIG. 1 shows that a system for real-time monitoring of the settling particles is employed to determine the starting time for collecting the residual or still unsettled mixed particles to be used for metallization. This system has a vertical settling cylinder 10. Near the bottom of the cylinder 10, two pairs of light emitters 11 and detectors 12 are located at two different heights with emitters on one side and detectors on the opposite side of a vertical cylinder 10, to sense the settling particles. The times for the particles to pass the top or bottom emitter/detector pair determine the particle size or type being monitored, while the times for the particles to traverse through the vertical distance d between the heights give their velocities. When the settling velocities of the two types (and sizes) of the powders are within a specified percentages, a slide shuttle 14 is moved to catch on the shuttle the residual or unsettled mixed powder of nearly equal settling velocities. These equal-settling mixed powders in suspension are separated for immediate metallizing use while the already settled powders are drained through the valve 15 for subsequent reuse.

It can be seen that the above method of minimizing gravitational segregation is useful not only in ceramic metallizing, but also in painting, depositing, injecting, mixed food preparation, or plasma spraying, with multiple solid and/or liquid particulate materials of differing densities and suspended in a gas, liquid, or paste.

Useful metallizing composition include the commonly used W:Fe or Mo:Mn system containing 10 to 30 weight percent of Fe or Mn, or their derivatives $WO_3$:- $Fe_2O_3$, $MoO_3$:$MnO_2$, or other non-oxide systems. From the atomic or molecular weights of the elements W, Mo, Fe, Mn, O, Cl, F, I, Br, ... or radicals $NO_3$, $SO_4$, ..., the weight percentage of the heavy metal W or Mo and the other braze and melting temperature-lowering metals such as Cu, Zn, Pb, Sn, Bi, Fe, Mn, Ag, Au, In, ... used for the paste, suspension, or solution metallizing compositions can be readily determined. Generally, I maintain the same ratio of 10 to 40 weight percent of braze metal to the 90 to 60 percent of heavy metal in these compositions.

There are other ways to insure a substantially constant chemical composition consisting of at least two types of metallizing materials having different densities and carried in a fluid suspension medium. One way is to cause the two types of materials to come out of the suspension medium in a substantially constant chemical composition thereby ensuring uniformity and reproducibility of the metallizing results. For example, the two types of materials may be integrated into physically integral and inseparable forms, such as by alloying the materials into integrated alloy form, or coating the internal and/or exterior surface of one type of material particles with the other material to form integrated coated powders.

Thus, tungsten particles may be alloyed or coated with iron to form integral or inseparable W-Fe powders. Similarly molybdenum powders may be alloyed or coated with manganese to form integral Mo-Mn powders that will not segregate.

Another method to minimize segregation of a single fluxing (e.g., MgO, $Y_2O_3$) or brazing (e.g., Cu, CuO, Zn, ZnO), cometallizing (e.g., Mn or $MnO_2$ with Mo or Fe or $Fe_2O_3$ with W) material is the use of an aqueous or other solution of W and/or Mo compounds such as sodium molybdate or tungstate which is soluble in water, or $MoO_3$ or $WO_3$ which is soluble in hot water particularly in the presence of $NH_4OH$. Here, the solution is the settling medium itself and suspended powders being of a single type, cannot segregate. Solutions of compounds of Cu, Zn, Fe, Mo, ... used with powders of W, Mo, $WO_3$, or $MoO_3$ achieve the same results.

To completely eliminate gravitational segregations, solution metallizing is the ideal process. Many molybdenum and tungsten compounds are soluble in water, alcohol, acid, or bases. $MoO_3$, for example, is soluble in hot or ammoniated water. Oxide, chloride, nitrate, sulfate, halogen, and other compounds of iron, manganese, nickel, antimony, lead, tin, copper, zinc, and bismuth are similarly soluble. Mixtures of W/Mo and the other solutions may be compounded into proper compositions for the metallization of various ceramics. The use of solutions of compounds, e.g., halides, of nickel, lead, tin, zinc, and copper allow these metal compounds to be reduced in a hydrogen or nitrogen/hydrogen atmosphere to supply the braze metal. In a single processing step, then, complete metallizing, brazing, and bonding is possible.

One difficulty of metallizing MACOR, Corning Glass's machinable glass ceramic, by the solution method is the relatively low, allowable metallizing temperature of about 950° C. The solubilities of the metallizing compounds are also restricting factors. Still, many potential metallizing compounds are soluble or at least partly soluble. Zinc chloride and sodium molybdate, for example, are soluble up to 432 and 65 grams, respectively, per 100 cc of cold water. Such a composite solution may be filtered to remove solid particles and used for metallizing various ceramics.

Useful W/Mo-based metallizing compounds include: X (X=W or Mo), $XO_3$, $Na_2XO_4$, $K_2XO_4$, $Li_2xo4$, and XH (H=$F_2$, $Br_2$, $Cl_2$, and $I_2$). Useful braze metal compounds include: many $YNO_3$, YH (Y=Cu, Ag, Au, Zn, In, Fe, Ni, Mn, Ga, Sn, Pb, Cd, Tl, ..., and H=F, Br, Cl, and I). Many of these compounds are soluble in water, alcohol, or solvents and can, therefore, be used to prepare metallizing solutions. Knowing the elemental atomic weights, one can readily compute the weight of metallizing W or Mo or braze metal in each gram of these chemical compounds.

Another important consideration in making joints between dissimilar materials relates to thermal mismatch stresses and strains. In any ceramic-metal joints, or for that matter, any joining of two dissimilar materials, the matching or mismatch of their thermomechanical characteristics in general, and thermal expansion coefficients in particular, is extremely important. From this mismatch of their thermal expansions, thermal stresses are generated.

Mismatches in other thermomechanical characteristics also result in other thermomechanical mismatch stresses and strains. The magnitude of these mismatch stresses and strains determines the failure probability of the joint.

Generally, the thermal expansion mismatch differentials of within 100 ppm (parts per million) are considered as allowable, according to Hagy and Ritland's paper on "Viscosity Flow in Glass-to-Metal Seals," J. Amer. Ceram. Soc., Vol. 40, pp. 58–62, 1957. Such thermal expansion coefficients and differentials relate only to the static or equilibrium case, and may not truly represent dynamic or transient conditions when the joint is being heated up or cooled down. Yet such transient conditions often exist during the services of the joint.

Unlike the commonly used static thermal expansion mismatch, the dynamic mismatch in thermal expansion coefficients is not constant but varies with the bonded materials shapes and sizes, physical and surface properties, and heating or cooling conditions and times.

As can be shown, the dynamic expansion strain mismatch may exceed the yield point of the ceramic materials, while the dynamic mismatch stress often exceeds the flexure of even comprehensive strengths of these same materials. What fails most ceramic-metal joints, or cause most coatings to crack, peel, flake, or spall, is thus the dynamic, rather than the static, thermal expansion mismatch.

Using this dynamic mismatch technique, we have been able to determine the location, magnitude, and occurrence time of the maximum or critical mismatch stresses, and take measures to reduce the dynamic mismatch stresses on the relatively weaker ceramic so that the ceramic is no longer failing from the high stresses.

Dynamic mismatches result partly from the fact that metals and ceramics have widely different thermal conductivities. The conductivities for metals range from 0.014 cal/sq. cm/cm/degree C./sec for tellurium, to 1.0 for silver (same unit), while those for ceramics are from 0.0018 for glass to 1.8 for beryllia.

During heating of a ceramic-metal joint, the ceramic temperature lags behind that of the metal, often markedly so; while under cooling the opposite is true. This produces different temperature profiles in the metal and ceramic at a particular time instant on either heating or cooling. Dynamic mismatches in temperatures, strains (i.e., expansions on heating or shrinkages on cooling), and stresses (strains multiplied by Young's moduli) then result.

Take the special example of the case of a long ceramic rod joined end-to-end to a similarly sized metal rod. The ceramic may be, for example, Corning Glass's machinable glass ceramic (MACRO), while the metal may be SAE 1010 carbon steel. The joint is brazed at 950° C. and is, for the worst-case condition, suddenly air quenched in a room-temperature (20° C.) ambient.

The Fourier equation for independent radial heat conduction in long ceramic and metal cylinders is well known. The solution of the cylindrical heat conduction problem consists of an infinite series, each term of which is a product of a Bessel's function and an exponential function, a given in various textbooks on heat conduction. Data tables and master charts for cylindrical heat diffusion have been compiled. See, e.g., 1961 Gebhart's "Heat Transfer," McGraw-Hill, New York). With these equations, data tables, and master charts, one can determine the temperature profiles at different locations (i.e., radial positions, r, in a cylindrical end-to-end joint) at various time instants. From these profiles the critical temperature profile with the associated, maximum transient mismatch stresses and strains can be calculated.

The cooling down of a MACOR-metal joint from the brazing to room temperature represents one of the most severe thermal changes, because of the wide temperature range involved. The step-by-step temperature changes, i.e., $u_m$ and $u_s$ for the temperatures of MACOR and steel, respectively, at cooling time t in seconds, at the center, (r=0) of the interfacial regions of a two-inch diameter, rod-type MACOR-steel joint are given in Table 1. Other tables have also been prepared for rods of different diameters.

The data used in the computations for Table 1 are: rod diameter D=2 in=5.08 cm, rod radius r=2.54 cm, surface heat transfer coefficient=0.1 per inch for both steel and MACOR, thermal diffusivities=0.108 cm$_2$/sec for steel and 0.0054 for MACOR, initial temperature of both MACOR and steel=950° C., and room temperature=20° C.

The computed data in Table 1 show, for the particular case treated, the maximum temperature differential between MACOR and steel at the axial center point, (or r=0), i.e., $\Delta u = u_m u_s$, at different cooling times t in seconds. Thus, immediately upon cooling after brazing (t=0), this differential is zero because both the MACOR are the same brazing temperature of 950° C.

TABLE 1

Nonsteady Heat Transfer Computations
For a 2-inch MACOR-Steel Joint
Cooling from 950° C. to 20° C.

| t | $u_m$ | $u_s$ | $u_m - u_s$ |
|---|---|---|---|
| 0.0 | 950 | 950 | 0 |
| 6.0 | 950 | 947 | 3 |
| 12.0 | 949 | 935 | 14 |
| 23.9 | 949 | 901 | 48 |
| 35.8 | 949 | 867 | 82 |
| 47.8 | 948 | 835 | 113 |
| 59.8 | 948 | 804 | 144 |

TABLE 1-continued

Nonsteady Heat Transfer Computations
For a 2-inch MACOR-Steel Joint
Cooling from 950° C. to 20° C.

| t | $u_m$ | $u_s$ | $u_m - u_s$ |
|---|---|---|---|
| 89.6 | 948 | 731 | 217 |
| 119 | 947 | 665 | 282 |
| 239 | 935 | 456 | 478 |
| 358 | 918 | 316 | 703 |
| 478 | 901 | 220 | 681 |
| 598 | 884 | 155 | 729 |
| 717 | 868 | 112 | 756 |
| 836 | 851 | 82 | 769 |
| 956 | 835 | 62 | 773 |
| 1200 | 804 | 39 | 765 |
| 1792 | 731 | 23 | 708 |
| 2390 | 665 | 22 | 643 |
| 3580 | 551 | 22 | 528 |
| 4780 | 456 | 21 | 436 |
| 5980 | 379 | 21 | 358 |
| 7170 | 316 | 21 | 296 |
| 9560 | 220 | 21 | 199 |
| 12000 | 155 | 21 | 134 |
| 14300 | 112 | 21 | 91 |
| 19100 | 62 | 20 | 42 |
| 23900 | 39 | 20 | 19 |
| 29900 | 27 | 20 | 7 |
| 35800 | 23 | 20 | 3 |
| 41800 | 21 | 20 | 1 |

Subsequently, faster cooling of the steel rod relative to MACOR causes this differential to increase with time t, until both rods are significantly cooled when the temperature differential decreases. After 29,900 seconds (8.3 hours), for example, both rods are within a few degrees of the room temperature at 20° C. The maximum temperature differential reaches 775° C. at about 1,000 seconds after the air cooling, giving rise to the maximum or critical dynamic mismatch stress and strain. Table 1 also shows that the temperature differential $T = u_m - u_s$ reaches 113°, 144°, 217°, 282°, 478° and 703° C. at 47.8, 59.8, 89.6, 119, 239, and 358 seconds, respectively, after the same cooling from 950° C.

By comparison, the maximum temperature differential of 727° C. at the axial center point of a one-inch (or r=1.27 cm) diameter MACOR-steel joint is reached sooner, at about 440 seconds after cooling.

The linear thermal expansion coefficients, f, are defined as the thermal expansion per unit length per unit degree Centigrade. As given in the literature, they refer only to the static case. These coefficients are constants, at least for the respective temperature ranges. Within these ranges, they are, therefore, independent of the specimen temperature, cooling or heating rates. In addition, these coefficients do not depend on the specimen geometries, sizes, diffusivities, surface characteristics, heating or cooling conditions, and initial and final temperatures. Each material thus has a singular, unique static expansion coefficient, at least for a given temperature range.

The static thermal shrinkage (or negative expansion) strain, e, for a given material is, by definition, the static thermal expansion coefficient, f, multiplied by the temperature range of cooling, u, i.e., $e = f \times au$. Thus, for the steel rod, this strain is: $e_s = f_s \times \Delta u_s$, and for the MACOR rod, it is: $e_m = f_m \times \Delta u_m$.

Under equilibrium conditions, the materials of the joint, i.e., MACOR and steel, are supposed to be in constant thermal equilibrium. That is, $u_m = u_s$. Both materials are thus at the same brazing temperature of $u_0$ at the beginning of cooling (t=0). Also, at any time t during the cooling, the cooling temperature range for MACOR and steel are always the same in the static case. Thus:

$$\Delta u_m = u_0 - u_m = u_0 - u_s = \Delta u_s,$$

and the static expansion mismatch strain between steel and MACOR is:

$$\Delta e = e_s - e_m = (f_s - f_m) \times \Delta u = \text{constant} \times \Delta u.$$

On the other hand, dynamic thermal expansion coefficients, f*, and the resultant dynamic mismatch strains, e*, and stresses, s*, strongly depend on the joint materials, geometries, sizes, physical and surface properties, and heating or cooling conditions.

Starting with zero strain on cooling from the brazing temperature of 950°C., the dynamic strain in the steel rod is: $e^*_s = f_s \times \Delta u_s$ where $\Delta u_s = 950 - u_s$, while that in the MACOR rod is:

$$e^*_m = f_m \times \Delta u_m \text{ where } \Delta u_m = 950 - u_m.$$

The difference in dynamic mismatch strain, i.e., $$\Delta e^* = f_s \times \Delta u_s - f_m \times \Delta u_m$$

The dynamic mismatch strain reaches a maximum of about 0.0123 at t=1,000 seconds. Such high strains exceed even the yield point of steel joined to the rigid MACOR ceramic.

The dynamic thermal expansion coefficient mismatch, Δf*, can be computed by dividing the dynamic mismatch strain, $e^*_s - e^*_m$, by the average cooling temperature range, i.e., $\Delta u_v = 950 - (u_s + u_m)/2$. This dynamic coefficient mismatch, for the 2-inch MACOR-steel rod joint cooling from 950° C. to 20° C., still depends greatly on the cooling time t. It reaches a maximum rate of about 29.6 ppm/degree C. at a cooling time of about 90 seconds, but continuously drops down to less than 5.6 ppm/degree C. at t=1,000 seconds, as can be computed from the data in Table 1. The total dynamic coefficient mismatch over the temperature range of 930° C. far exceeds the maximum of 100 ppm considered allowable by Hagy and Ritland.

It can also be shown that the dynamic expansion coefficient mismatch, $\Delta f^* = (f^*_s - f^*_m)av$, for the 2-inch MACRO-steel rod joint controling from 950° C. to 20° C., is two to five times greater than the corresponding mismatches for the static or equilibrium case, for cooling time t of 10 to 10,000 seconds.

Statically, MACOR only marginally "matches" with a few low-expansion metals such as Sylvania #4, Dumet, 50% nickel alloys, chrome-iron stainless, platinum, Sealmet, and titanium, according to Corning Glass. Because of this two to five times greater dynamic expansion coefficient mismatch relative to the static coefficient mismatch, we must conclude that, dynamically, MACOR and steel joints now become totally "mismatched", at least in so far as the specimen configuration, size, and brazing conditions given above are concerned.

To approximately compute the dynamic mismatch stresses, one may further neglect the presence of the braze and the metallized layers, and use a Timoshenko approach as follows. Consider a portion of the steel specimen of unit length and unit cross-sectional area, brazed together with a MACOR specimen of equal length and cross-sectional area. At time t=t after cooling from the brazing temperature of 950° C., the temperature of the steel is $u_s$ and $\Delta u_s 950 - u_s$, while the temperature of MACOR is $u_m$ and $\Delta u_m = 950 - u_m$. The steel specimen has thus shrunk from unit length to $1 - f_s \times \Delta u_s$, while the MACOR has shrunk to $1 - f_m \Delta u_m$. The steel has shrunk more than MACOR, since both $f_s$ and $\Delta u_s$ are greater than $f_m$ and $u_m$. To maintain joint integrity particularly at the ends, the originally stress-free but overshrunk steel must be stretched with dynamic tensile stress $s_s^*$ by the adjoining MACOR, to length y from length $1 - f_s x \times \Delta u_s$, while the undershrunk MACOR must be compressed with dynamic compressive stress $s_m^*$ by the steel, to the same length y from length of $1 - f_m \times \Delta u_m$.

Hence, the tensile stress in the steel, $s_s^*$, is $$s_s = E_s \times (y - 1 + f_s \times \Delta u_s)/(1 - f_s \times \Delta u_s)$$

where $e_s$ is the Young's modulus of steel, i.e., 30,000,000 psi; while the compressive stress in MACOR, $s_m$, is $$s_m = E_m(1 f_m \times \Delta u_m - y)/(1 - f_m \times \Delta u_m)$$

where $E_m$ is the Young's modulus of MACOR, i.e., 5,000,000 psi.

Apparently, $s_s^* = s_m$. Hence, $$y = ((1 - f_m \times \Delta u_m)E_m + (1 - f_s \times \Delta u_s))/(E_s + E_m)$$

From these equations, we compute the equal dynamic mismatch stresses in MACOR and steel, $s_m^* = s_m$, to reach over 52,800 psi, well above MACOR's flexual strength of 15,000 psi or even its comprehensive strength of 50,000 psi.

Similarly, dynamic or transient differences in temperatures, thermal expansion coefficients, thermal expansion strains, and thermal mismatch stresses have been computed for differently sized cylindrical MACOR-steel joints, at various radial locations and cooling time instants. The dynamic mismatch stresses and strains are all unexpectedly high. Measures must therefore be taken to reduce the dynamic mismatch stresses on the relatively weak ceramic so that the ceramic is no longer subjected to the high stresses. This reduction can be achieved by, e.g., absorbing a major portion of the dynamic mismatch stresses normally present in the ceramic through the use of a soft, yieldable metallic braze. These measures prevent the brazed joint failures particularly from these dynamic mismatch stresses, because residual or actual mismatch stress between the two joined materials is the theoretical mismatch stress with a portion thereof absorbed in the metallized or brazed layer.

Specifically, this invention also describes the following methods, for uses singly or in combination, to minimize or neutralize these high mismatch stresses and strains:

(1) Using a soft, yieldable metal layer to braze the metallized ceramic to the metal, and to absorb within the braze layer a large or major portion of these mismatch stresses so that the relatively weak MACOR or other ceramic is no longer subjected to high stresses thereby preventing fractures;

(2) Radially grading, or controllably and gradually changing, in (i.e., parallel rather than perpendicular to) the joining plane or bonding interfacial region, the thermal conductivity (or reciprocal of thermal resistivity), expansion coefficient, and tensile strength of the braze metal, to ensure that the maximum residual mismatch stress, after absorption in the braze or the shock-absorbing interfacial region to be described below, will not exceed the local material strength in the ceramic at any point and time;

(3) Axially grading, or controllably changing normally of or perpendicular to the joining plane or bonding interfacial region, from the ceramic side toward the metal side, the thermal expansion coefficient of the braze layer to minimize direct mechanical interaction between the steel and ceramic members;

(4) A toughened and strengthened microengineered interfacial region between the ceramic and metallized layer to absorb thermomechanical shocks;

5) A new method to achieve flawless bonding regions; and

6) Breaking up a large ceramic-metal coated or bonded region into small, mosaic-like pattern segments to reduce the maximum mismatch stresses and strains.

Figure 6:
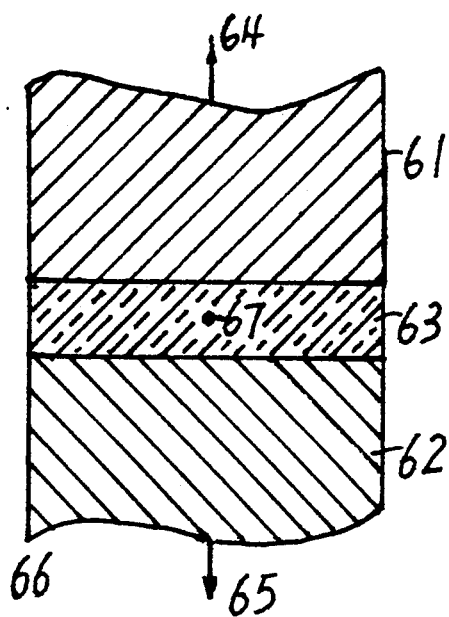
FIG. 6 shows a cooling method after metal-ceramic bonding to achieve controlled solidification and desired elemental segregation for overcoming dynamic mismatch stresses.
Figure 7:
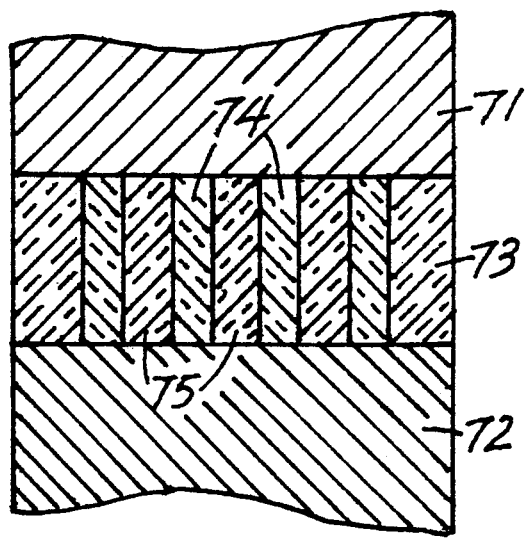
FIG. 7 shows a new method of overcoming mismatch stresses.

7) Controlled cooling of the liquid braze layer to achieve radially outward solidification and elemental segregation for the desired radial grading properties patterns (FIG. 6);

8) Using as the braze layer a plurality of strong columns of small lateral dimension, L, embedded in a matrix of soft metal to minimize expansion differential, which is the product of L and the thermal expansion coefficient differential (FIG. 7);

9) Using elongated reinforcing fibers or sheets placed along the potential fracture path and variably oriented to best resist tensile fracturing stresses (FIG. 8); and 10) Combining radial grading with the conventional axial grading to change the thermal expansion coefficient of the braze layer from the ceramic side toward the metal side, to minimize direct mechanical interaction between the steel and ceramic members.

The first two objectives are achieved by providing a novel composite metallic braze layer or disc 10 consisting of a central copper core 11 inside an outer copper alloy ring or washer 12 made of, e.g., 70:30 Catridge brass. This composite metallic disc joins together a ceramic body 14 and a metal body 15, as shown in FIGS. 1a and 1b. This disc, lying parallel to and forming part of the bonding interfacial region, has The linear thermal expansion coefficient of pure copper is 16.5 ppm/degree C., while that of, for example, 70 Cu:30 Zn Catridge brass is 19.9 ppm/degree C. Also, the tensile strength of the brazing-annealed soft pure copper is only 15,000 psi, while that of the 70:30 Catridge brass is over 40,000 psi, or about three times greater.

Hence, the tensile strength and thermal expansion coefficient of the peripheral region in my composite braze disc is 2.67 times and 1.21 times, respectively, those of the central pure copper core. The thermal conductivity of pure copper at 0 degrees C. is 0.920, while those of 11% and 32% Zn:Cu are 0.275 and 0.260, respectively. Hence, the thermal conductivity of 30% Zn:Cu Catridge brass is about 0.261. That is, the thermal conductivity of the peripheral catridge brass in our composite braze disc is only, 0.261/0.920=28.4%, or much less than 50% or 70% of, that of the central pure copper core.

These combinations of linear thermal expansion and tensile properties achieve the required results. In a ceramic-steel joint, the maximum or critical transient mismatch temperatures, dynamic expansion mismatch, and thermal strains and stresses occur in the axial centers of th interfacial regions. I therefore have dead soft, brazing-annealed, pure copper at the core regions. This copper, with a yield strength less the fracture strength of the ceramic, is highly and easily yieldable to absorb much or most of the dynamic mismatch thermal strains and, therefore, stresses. Pure copper also has relatively low thermal expansion to reduce these mismatch effects in the first place. In addition, the pure copper is a good thermal conductor, equalizing the temperature between the centers, as well as their outer and regions, of the steel-MACOR joint, and thus further minimizes mismatch strains and stresses.

On the other hand, the outer peripheral regions of the braze disc is made of relatively highly expansive but the low thermal-conducting brass. At these peripheral regions, the mismatch temperature differentials are relatively small. The higher tensile strength is even desirable at the large-area peripheral regions to enhance the joint strength.

This composite braze disc design will thus provide the required radially tailor-graded profiles of braze composition, thermal expansion coefficient, braze strength, and thermal conductivity needed to overcome or minimize the critical dynamic mismatch stresses.

The composite braze discs can be made by, for example, metallurgically cladding or mechanical press-forming a sphere or disc inside a washer, at least two concentric tubes, or other combinations of different materials.

Elemental interdiffusion during the braze manufacture, brazing operation, or special pre- or post-brazing heat-treatment can modify or provide any reasonable composition profiling in the braze discs for achieving the desired tailor-grading results.

To practice this lateral grading invention, skilled persons can, of course, select other yieldable metals such as gold, silver, tin, lead, indium, zinc, iron, nickel, or other materials to replace copper, and select other chemical elements to replace the copper strengthening zinc. The resultant new alloys will, of course, be different in compositions, strengths, diffusivities, thermal conductivities, melting or softening points, and other properties.

Thus, Cu-Ag, Cu-Al, Cu-As, Cu-Bi, Cu-Ca, Cu-Cd, Cu-Fe, Cu-Li, Cu-Mg, Cu-Mn, Cu-Ni, Cu-P, Cu-Pd, Cu-Pt, Cu-S, Cu-Sb, Cu-Si, Cu-Sn, Cu-Te, Cu-Ti, Cu-Zr can be similarly used to minimize dynamic mismatch stresses. Alloys of Ag, Al, Au, Bi, Cd, Co, Cr, Ge, Fe, Ir, Li, Mg, Mn, Mo, Ni, Pb, Pd, Pt, Rh, S, Sb, Si, Sn, Ta, Te, Ti, V, W, Zn, Zr, rather than Cu, are also useful.

By properly controlling the cooling of a metal-ceramic joint, the desired lateral grading effect can also be achieved. For example, as shown in FIG. 6, after the joining of a metal cylinder or plate 61 to a ceramic cylinder or plate 62 of about the same diameter, the cylindrical surfaces are insulated thermally or cooled slowly relative to the free or unjoined ends. Heat is then extracted mainly axially at these ends 64 and 65. The center 67 of the bonding regions is thus cooled fast and solidified first. The solidification therefore propagates radially outward. According to the Ag-Cu phase diagram, in a Ag-Cu alloy a braze disc, the first-freezing center portion has relatively pure Ag or Cu metal, if the original alloy composition contains less or more, respectively, than 28 weight percent of Cu. According to the theory of alloy solidification, subsequently solidifying cylindrical layers in the resultant braze disc will be less and less pure in Ag or Cu. The last solidifying cylindrical surface layer will be the Ag-Cu eutectic containing 28% (by weight) of Cu and 72% of Ag. Thus, the physical properties are laterally graded, by solidification, in the solidified braze disc. The central relatively pure metal portion of the bonding region will be softer and more thermally conductive than the peripheral eutectic region. By selecting a suitable initial braze composition, the center can even also have a smaller thermal expansion coefficient than the peripheral eutectic, achieving maximum reduction in dynamic mismatch stresses.

This controlled cooling method is particularly effective with large, flat joints when the ratio of diameter or lateral size is large relative to the length or thickness, facilitating central axial cooling first.

FIG. 7 shows a joint between a metal 71 and a ceramic 72 whose braze layer 73 consists of a plurality of load-carrying strong columns 74 (e.g., 70:30 cartridge brass) embedded in a relatively soft matrix 75 of pure copper. Since the individual strong columns 74 have minimal lateral dimensions (a few millimeters or less), the thermal mismatch expansion strains and stresses are small.

Figure 8:
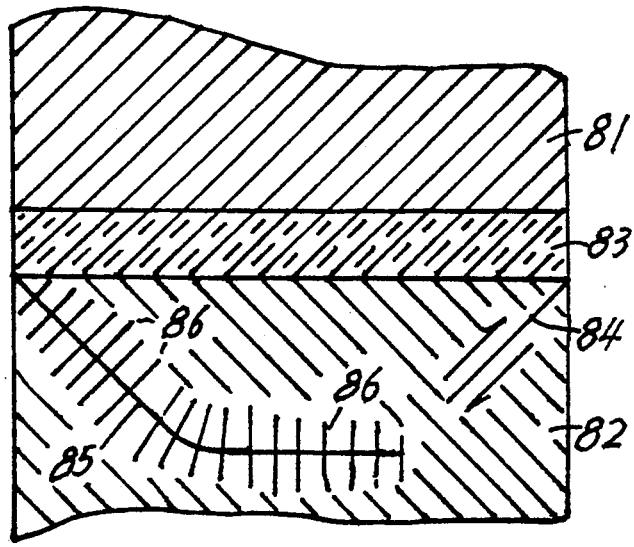
FIG. 8 shows another composite method involving reinforcing fibers strategically positioned and oriented to overcome interfacial surface failures in the ceramic.

FIG. 8 shows the usual failure patterns in a metal (81)-ceramic (82) joint, or coating of ceramic on metal, due to mismatches that result in debonding, cracking, blistering, peeling, and spalling. The initial crack occurs at the peripheral surface between the metal (including braze 83) and ceramic 82 and is inclined at 45° to the horizontal. The mismatch stresses are tensile in the metal 81 but compressive in the ceramic 82. The compressive stress induces a shear which is maximum at the 45° plane 84 (see the right side of the figure). The crack or fracture thus initiates at 45° but levels to horizontal. By placing elongated reinforcing members 86 such as strengthening carbon fibers or weaved sheets 86 in the $Al_2O_3$ ceramic 82 along the fracture path in varying directions locally normally of the tensile stresses to best take up the tensile mismatch stresses along the fracture path 85, the failure may be prevented. Note that in the left side of FIG. 8, the directions of the elongated reinforcing fibers change from 45° at the metal-ceramic interface to nearly vertical deep inside the ceramic 82.

Another method to overcome dynamic stresses is to grade the composition, and therefore the thermal expansion coefficient and other physical properties in such a way that the local composition gradient is roughly proportional to the local temperature gradient. There are four cases to be considered for this functional grading:

1. Maximum critical dynamic stresses occur when the ambient-exposed surface is rapidly heated with a constant ambient temperature heating, such as inserting a ceramic-metal bond into a constant-temperature hot or furnace environment;

2. Maximum critical dynamic stresses occur when the outer surface is rapidly heated with a fixed quantity of heat, such as during high-intensity, constant-power pulsed laser or electron beam pulse or pulses;

3. Maximum critical dynamic stresses occur when the outer surface is rapidly cooled with a constant ambient temperature bath, such as when the ceramic-bond joint is rapidly quenched in, e.g., air or water of constant temperature;

4. Maximum critical dynamic stresses occur when the surface is rapidly cooled by taking away a fixed quantity of heat, such as applying a fixed quantity of water for rapid evaporation and heat absorption per unit area of the outer surface.

In the thermal or the equivalent material diffusion art, cases 1 and 3 are "infinite source" diffusions and give error function complement (erfc) solutions, while cases 2 and 4 are "constant-source" diffusions and give exponential function for their solutions. To overcome dynamic mismatch stresses due to transient thermal heating, I functionally grade the material compositions as to the major alloying element or elements, and to decease the thermal expansion coefficient or to increase the strength in proportion to their content such that the surface composition is also either error-function complementally graded or exponentially graded in the proper direction, respectively for cases 1 and 3, or 2 and 4. For cases 1 and 2 where heat is applied, I shall add the major element or elements to in-diffuse, while for cases 3 and 4, I shall subtract the major elements (i.e., getter material) to outdiffuse material. For infinite material source, I use constant-concentration ambient such as unlimited supply of gaseous, liquid, or solid diffusing material. For constant material sources, I use limited or fixed quantity of diffusing material. For in-diffusion, I use diffusant materials, while for outdiffusion, I use gettering material to get or remove from the surface the major elements. After the material surface diffusion or outdiffusion treatment, with a constant or infinite source, the resultant surface composition profile or critical physical property profile will be similarly shaped (i.e., exponentially or erfc graded) like the anticipated maximum critical transient temperature profile. This condition insures that the local maximum stress never exceeds the local material strength at any time, and thus best withstands the transient thermal stresses due to this type of transient heating or cooling.

The above two and other methods of overcoming dynamic mismatch stresses are not only useful for dissimilar material joints, but for even a single-phase homogeneous material subjected to critical thermal surface profiles, such as when a carbon-carbon composite is subjected to high-intensity laser pulses, or severe surface quenching when hot.

Each metal-ceramic joint or bond must be specially designed. The factors in joint design include metal and ceramic composition, joint failure modes, parts shapes and sizes, thermal and other requirements. The requirements for the National Aero-Space Plane (NASP) is totally different from those of the diamond heat sinks or fusion reactors. A ceramic-metal bond designed for maximum mechanical strength is usually not the best for thermal conductances, which is critical in heat sinks. What is best for one application (e.g., for preventing rapid heating failures) may even be precisely the worst for another (e.g., for preventing severe quenching failures), as shown by the functional grading technique described in this application. On the NASP, for example, the best titanium-$Si_3N_4$ joint for the turbine subjected to rapid heating should not be used for the wings of the same plane subjected to possible ice quenching failures. A joining method for many conditions may not be the best for any application.

My lateral grading technique produces graded metal-ceramic microjoints in parallel, while the conventional axial grading technique produces graded metal-ceramic microjoints in series. The optimum combination of the two lateral and axial grading can be analyzed by simulation techniques. Even electrical analog techniques can be used to determine the optimum combination of parallel and series microjoints by arranging electrical resistors or capacitors in various parallel/series combinations, either in actual experiments or on the computer.

All the above measures increase the ratio of the ceramic material strength to the dynamic and/or static mismatch stresses due to differential temperatures and thermal expansions so that these mismatch stresses do not exceed the ceramic material strength at any point and time thereby preventing blood failures.

If all these measures are still insufficient to prevent dynamic thermal mismatch failures, axial elemental grading or sudden composition changes may be added. On method consists of providing a disc of low-expansive metals such as Sylvania #4, Dumet, 50% nickel alloy, chrome-iron stainless, platinum, Sealmet, and titanium placed intermediately between the steel and the copper braze. In this way, the ceramic MACOR is mechanically isolated from the highly expansive steel. The desired elemental profiling can also be achieved through controlled diffusion.

In addition to achieve metallizing uniformity and minimal mismatch stresses, I have also found it desirable to microengineer the chemical compositions, microstructures, and mechanical properties of the bonding interfacial regions between the ceramic and metallized layer. Merely perfecting the interface surfaces alone, as is commonly done, is inadequate to produce strong and reliable joints for withstanding the unavoidable, severe mismatches stresses and strains as shown above.

Different physical, chemical, and electrical metallizing or film-forming methods have been developed. Each has its unique advantages. Some, for example, are atomically precise. Others thoroughly clean the substrate surfaces for better adhesion. Some others result in crystalline epitaxy, which is necessary for semiconductor or other devices. Others produce splat cooling and superfine grains, with resultant enhanced mechanical properties, for example, increased Young's modulus. Still others are done at low temperatures to avoid unwanted thermal effects. But none deal effectively with the critical problem of thermal mismatch stresses and strains.

For extremely shock-resistant joints or metallized layers, I have found it absolutely necessary to have a carefully microengineered interfacial layer between the ceramic and the metallized layer. This layer is designed to absorb the major portion of the always present mismatch stresses and strains. Many of my ceramic metallizing processes typically last more than 20 minutes and involve liquid-forming layers containing, directly or indirectly, $MoO_3$ which melts at 801° C., and $WO_3$ which melts at about 1550° C. but can be further reduced by alloying with other compounds of metal such as ZnO or PbO. Liquid diffusion is rapid with diffusion coefficient $D_1 = 1$ E-4 to 1 E-5 cm$^2$/sec. Processing for $t = 20$ minutes gives a diffusion length of up to the square root of $D_1 \times t = 0.35$ to 0.11 cm. In addition, a diffused interfacial layer of graded composition, microstructures, and mechanical properties is formed which can be highly shock-absorbing.

In contrast, most conventional coating processes involve only solid-state diffusion. Solid diffusion is slow with diffusion coefficient $D_s = 1$ E-10 to 1 E-20. Even for the same processing or diffusion time t, which these processes do not have, the diffusion length is only 3.2 microns to 3.2 Å, or several orders of magnitude shorter than that in my liquid diffusion case. The mismatch stress gradient is thus proportionally steeper.

Plasma spraying does involve liquid droplets in rapid transit. These extremely high-temperature droplets impact the substrate at very high velocities resulting in splat cooling with millisecond liquid dwell times. The resultant diffusion length is thus also over three orders of magnitude shorter than my metallizing or metallizing-brazing case. Splat cooling gives very fine grains with high Elastic moduli which actually increase the mismatch stresses. Also, the superheated liquid particles form oxides, nitrides, or other surface layers during transit preventing perfect bonding between the particles themselves. Laser, electron, and some other energetic beam enhanced coating processes also give splat cooling and solid-diffusion conditions.

Without applying any external pressure to force the joining members together, I have used metallizing and bonding processes described above to join various ceramics to metals with pure copper brazes. A typical metallizing process comprises using a mixture of metallizing composition such as $WO_3$-$Fe_2O_3$ or $MoO_2$-$MnO_2$ in suspension or paste form and applied onto the ceramic, heating for 5 to 25 minutes the coated ceramic to about 800°–1500° C. but under no applied pressure. The ratio of heavy metal W or Mo to Fe or Mn after reduction from the compounds is between 9:1 to 6:4. This metallizing may be followed by or simultaneously done with brazing with, e.g., copper or its alloys. Hydrogen or forming gases of 10 to 40 volume % of hydrogen is the desirable metallizing atmospheres.

Different compositions other than the usual W-Fe or Mo-Mn may also be used. For example, metal powders or oxides, carbonates, nitrates, chlorides, fluorides, iodides, bromides, or other compounds of W, Mo, Cu, Ni, Bi, Sn, Pb, Sb, . . . may be employed, generally in amounts from 10–90 by weight percent of the equivalent refractory W or Mo metal. Even W or Mo is not necessary, if active metals such as Ti and Zr are used to bond the ceramics. But the many other inventions of this application still apply such as on reducing dynamic mismatch stresses, sealing ceramic surface defects, toughening and strengthening ceramic surface regions through microcomposite forming (with hard reinforcing particulates, roots, branches, networks), functional grading, lateral grading, large-area joining, eutectic joining, and the like).

W or Mo may not be necessary for another reason. In joining carbon (graphite, diamond) to iron alloys (steels, stainless steels, alloy steels), a single-step eutectic metallizing/brazing method may be used. This involves contacting carbon directly onto the steel, and heating the assembly to a temperature of from 1080°–1350° C. Pure iron and carbon form a eutectic at 1154° C. at 4.3% by weight, of carbon. But common steels contains other elements such as Mn, Si, S, P, Al, Cr, Ni, . . . All these elements lower the eutectic temperature and shift the eutectic carbon composition. Many of these elements themselves are eutectic formers with carbon. Hence, useful bonding with common carbon steels occur even at about 1050° C. However, the higher the bonding temperature, the better the bond strength and thermal shock resistance. The controlled cooling method of FIG. 6 may be used in addition here to advantage.

The graphite, carbon, or diamond surface may be first coated with a layer of the W/Mo-based material prior to the single-step metallizing/bonding process. The bonded carbon-steel joint may be and or water quenched while hot or molten to achieve the high strength and hardness of steel.

Using the same C-Fe eutectic brazing principle, other carbon-metal bonding methods are possible, according to T. B. Massalski's Binary Alloy Phase Diagrams, ASM, 1986, carbon also forms eutectics with: Au:3/1050 (namely, Au with 3 weight percent of carbon forms eutectic at 1050° C.), B:1.5/2075, Co:2.68/1321, Cr:3.2/1400, Hf:0.2/2250, Ir:1.6/2296, La:2.2/806, Li:2/165, Mn:1.3/1215, Mo:3/2205, Nb:7.5/2339, Ni:0.6/1326, Os:1.32/2732, Pd:2.8/1504, Pt:1.2/1705, Re:1.3/2486, Rh:2.1/1694, Ru:1.8/1924, Si:0.5/ 1404, Ta: 2/2825, Th:0.5/1720, Ti:0.5/1648, U:0.1/1119, V:4/1650, W:1.9/2715, and Zr:0.4/1823.

The metallizing temperatures and times depend on other factors. Diamond, for example, should not be metallized above about 900° C., to minimize chemical reactions nor should graphite fibers be treated above about 750° C. In both cases, a carburizing atmosphere, such as one containing $CH_4$ or propane, may be useful to prevent too much loss of carbon.

The ceramic I have described already bonded with my W/Mo-based metallizing methods described here include: alumina, zirconia, silicon carbide, beryllia, yttria, graphite, quartz, silicon, mullite, cordierite, Corning's MACOR and Vision glass, diamond, piezoelectric ceramics, and 123 high-temperature superconductors. Useful structural metals for the joints include copper, nickel, stainless steel, high-nickel or cobalt iron alloys, or even highly "mismatched" ordinary cold-rolled SAE 1010 carbon steel. These joining metals can, therefore, be used as the braze metals themselves for more refractory metals in the joints. Even with the "mismatch" between ceramic and carbon steel, structural joints brazed with pure copper can be repeatedly thermal cycled without fractures between 980° C. and ice water followed by mechanical shocks including 8 to 10-foot drop tests onto carpeted, wood, or even marble floors.

Similarly, Poco graphite AXF-5Q to SAE 1010 carbon steel rods, ¼" in diameters and joined end-to-end, are almost mechanically indestructible, even when pounded hard with a 12-oz hammer. These joints also are resistant to rapid quench from 800° C. to 0° C. in ice water and severe mechanical shocks. Carbon-carbon composite with carbon steel joints have comparable made. Joints of diamond to carbon steel can also withstand 850° C. shocks.

These results show that with my improved processes, low-cost "mismatched" ceramic/metal, carbon-metal, ceramic-ceramic, or ceramic-graphite joints can be made; that these joints can be mechanically strong and thermally shock resistant; that the bonding processes, being ceramic material-limited, need no further improvement for the particular material combinations and thermal shock requirements; and that these joints are, after bonding and thermomechanical shocks, free of pores, microcracks, inclusions, inhomogeneities, and other defects at which fractures originate. Each of these shocks would multiply the number of defects exponentially and have failed the joints. These joints, including particularly the metallized joints, thus compare favorably with, e.g., certain ceramic-metal joints or ceramic metals developed at great cost, as reported in the literature. Surface plating or coating my metal-ceramic joints in various forms with ceramics (including diamond, SiC, $Al_2O_3$, $ZrO_2$) or precious and refractory metals (Pt, Pd, Ir, Hf, Au, Cr, . . . ) makes the joints resistant to corrosion, erosion, oxidation, or surface reactions. Properly designed, metal-plated or coated ceramic-coated metals metal-coated ceramics, structural metal-ceramic joints, are biocompatible as implanted bones, teeth, or organs.

Note that are new joints use only thin layers, not bulks, of tungsten/molybdenum; and generally contains no other strategic and expensive metals such as nickel, cobalt, or chromium. The metallized layers adherently joins to the ceramic. Upon this metallized layer, tenacious, protective metal or ceramic layers can be brazed or formed which resist spalling, peeling, and thermomechanical shocks. Improved corrosion, wear, or frictional properties on these coatings are also possible by suitable selection of the coating materials. A solid lubricant system may be made, e.g., comprising graphite, talc, or $MoS_2$ powders chemically bonded in copper, bronze, nickel, steel, or cast iron. Also, carbon-carbon composite with improved strength and oxidation resistance are possible. Advanced chemically bonded intermetallic compounds and materials (titanium or hafnium carbide, and titanium or nickel aluminides) are also made available. The same W/Mo-based metallizing compositions are even useful as almost universal high-temperature adhesives or sealants for ceramics or metals.

It is even possible to leave only the metallizing molybdenum and/or tungsten between the materials to be joined without any braze metal layer, the operating temperature of the joint is then generally limited by the melting point of the metallized layer.

The flawless and effect-free quality of my ceramic-metal joints or metallized layers on ceramics or graphite are particularly important for tough, fatigue-resistant, protective, easily wettable, and thermochemically stable coatings on, or joints between, ceramic, metals, or graphite. A metallized or coated graphite fiber, for example, cannot tolerate a single pinhole or microcrack that allows oxygen to penetrate and to destroy the fiber. Ceramic coatings on metals also cannot have defects when exposed to chemically reactive, high-intensity ion or plasma, high temperature, or other extreme environments. High-melting precious metals such as Pt, Os, and Pd and oxidation resistant metals such as Cr, Al, and Ni are therefore beneficially applied onto the metallized layer, or be formed simultaneously with a metallizing-brazing composition in a single-step metallizing-coating process. Less protective metals such as gold, copper, magnesium, titanium, or zirconium may also be applied onto, formed simultaneously with, the metallizing layer, followed by coating by electrolytic, electroless, or spraying methods, of the above-mentioned oxidation resistant metals for oxidation protection.

In addition, the metallized or metallized/brazed layers have good wetting characteristics. Further, the metallizing or metallized/brazed layer penetrates and seals all surface pinholes, microcracks, or other defects to strengthen the ceramic at the bonding region. A thick (over 100 microns thick) metal layer further toughness the brittle ceramic. Graphite or carbon fibers or particles may thus not only be oxidation resistant but surface toughened and non-brittle.

My invention also leads to a new generation of "high-fidelity" machining tools made of diamond, alumina, zirconia, boron carbide, boron nitride, zirconium carbide, or other hard ceramics. With my method, these ceramics are defect-freely and tenaciously joined to rigid metals including inexpensive carbon, stainless tool, or other alloy steels, or even tungsten carbide. In present clamped-on or screwed-on ceramic tool bits, the fragile ceramic is highly prestressed even when the tool is not in use. Maximum useful stresses can, therefore, not be applied during actual usage. My new tools are not prestressed locally and will not work loose under any conditions. Also, in contrast to other bonded ceramic tools, the bonding regions in my new tools are defect-free and actually strengthen the diamond or ceramic, because of sealing of surface defects on the surface and compressive surface stresses due to the more shrinking metallized metal layer. The metallize/braze perfectly wets and bonds the ceramic even on the microscopic scale, fully microsupports the ceramic tool tip, and prevents the ceramic from moving, deforming, vibrating and fracturing. Hence, even under extreme vibrations, heavy loads, or thermomechanical shocks, the machining forces, positions, and motion are transmitted directly and with high fidelity to the tool tips. Greater machining accuracy, less tool chatter, wear and breakage, and longer tool life and reliability are possible.

Natural or synthetic diamond is rigid, noncontaminating, and chemically stable, readily cut to precise sizes, and easily cleaved and polished to microinch finishes. Excelling also in electrically insulating the thermally conducting properties, it thus is a potential heat-sinking substrate for high-power, laser, microwave, and fast-switching VLSI circuits. These things combined lead to the densest packing, best high power, high frequency, high temperature, and radiation-hard devices. Diamond circuits could operate at up to 600° C. or 475° C. higher than Si or GaAs, respectively, eliminating cooling equipment now occupying, e.g., 65% of the average satellite.

A most common method of metallization in semiconductor contacting, or for bonding diamond to copper for diamond heat sink application, consists of first sputtering a layer of 600 A titanium, followed by 1,200 A of platinum and one micron of gold. The titanium bonds to the diamond, while the gold bonds to the metal. The platinum is a diffusion barrier to prevent interaction between titanium and gold. The entire bonding process is thus costly, complicated, and degrading to the product. Still, the product often fails because of peeling, blistering, intermetallic formation, and unwanted reaction between different phases.

In addition, the abruptly graded multiple serially bonded (Cu-Au-Pt-Ti) layers suffer seriously in two respects because:

1) The mechanically and chemically weakest layer, no matter how thin, controls the entire bond-Law of the Chain; and 2) During any processing or service, the possible existence of severe mismatch stresses between different layers or a single weak, brittle, or unstable phase in the entire relevant phase diagrams at any temperature, no matter how transient, can totally destroy the entire joint-Murphys Law.

My laterally graded seals, or graded metal-ceramic microjoints in parallel, do not have these problems.

Diamond has the highest thermal conductivity, breakdown voltage, saturated velocity, and radiation resistance but lowest permitivity. Combined, these parameters yield the Johnson figure of merit for the power and frequency performance, and the Keyes figure of merit of the speed, of a transistor manufactured from diamond. These figures of merit are respectively 8,206 and 32.3 times higher for diamond than they are for silicon. High-density, diamond active circuits can operate at up to 600° C. or 475° C. higher than Si or GaAs, respectively, eliminating cooling equipment now occupying, e.g., 65% or the average satellite. However, serious material and processing problems still exist. Presently, only p-type conductivity can be obtained at useful current level by implanting boron. The evidence of n-type conductivity is not convincing. Further, even at 1,450° C., it is difficult to completely anneal the heavily damaged regions of the diamond. Most of the n-type conductivity was lost after prolonged annealing. The results of ion implantation are further complicated by the fact that the radiation damage introduces donors and acceptors in equal concentrations. Even the exact nature of these donor center is still unresolved. The only n-type diamond samples to date were made by ion implantation of lithium into natural diamond.

Because of the many difficulties of n-type doping by ion implantation, I use a diffusion procedure. Essential to controllable, uniform diffusion doping is intimate atomic contact of the doping source and diamond on the microscopic scale. That is, a perfect wetting of the diamond with the liquid diffusion source and perfect bonding of a solid diffusion source is required.

Reliable wetting or bonding of diamond to metals has been very difficult, as indicated above. But I have solved this diamond wetting and bonding problems using a modified W/Mo-based fusion metallizing method. In this diamond (and SiC) bonding method, I use a metallizing/brazing/contacting method consisting of 10-30 v/o (volume percent) Mo, 40-80 v/o Cu and 5-30 v/o Bi for processing at 900°-1170° C. This diamond-bonding method is also useful for other ceramics such as SiC.

My method solves the problems mentioned above, except for the low solubility of potential atomic dopants in diamond. This method is extremely simple, and provides ideal conditions for controlled diffusion in diamond. The method achieves many purposes some of which are relevant to dopant diffusion in diamond:

1) Atomically cleans the diamond surface;
2) Perfectly wets the diamond even on the microscopic scale;
3) Defect-freely bonds the diamond upon cooling;
4) Seals porosities, microcracks, and other defects in the diamond surface region, and thereby increases the contact surfaces (for, e.g., improved means and thermal diffusion) and toughens and strengthens the diamond;
5) Due to the high processing temperature, provides dead-soft shock-absorbing metal layer on the surface, minimizing thermomechanical stresses on, and stabilizing carrier mobilities in, the diamond; and
6) Supplies low-resistance electrical and thermal contacts to the diamond; and
7) Preages and burns-in the metallization contacts, which is the predominant failure mechanism of hard semiconductors (SiC, diamond).

I use the same fusion metallize/braze medium for n-type doping in diamond, by simply adding n-type dopants in the W/Mo-based metallizing/brazing medium.

Liquid diffusion is rapid, with constant diffusion coefficient $D_1 = 1.E-4$ to $1.E-5$ cm$^2$/sec, simplifying doping process control. Processing for our typical 20 minutes gives a diffusion length of up to the square root of $D_1 \times t$, i.e., 0.35 to 0.11 cm, amply large for practically all semiconductor device designs. Diffused interfacial regions of graded compositions, microstructures, and mechanical properties also form which are not only highly stress-absorbing but stabilizing to electronic carrier mobilities.

Indeed, my diamond metallizing processing steps fully stabilizes, preages, and burns-in the diamond and, therefore, generates very reliable metallization contacts. Reliable contacts is important because metallization has been considered to be the predominant failure mechanism of reliable diamond electronics. There will also be no dopant outdiffusion and redistribution, because of the thermodynamic equilibrium of constituents even at the high metallizing/doping temperatures. This is in shart contrast to ion implantation and other doping methods, where the dopant atoms are barbarously forced into the semiconductor with high voltage and momentum, with highly unstable results event at low temperatures.

Conversely, most conventional doping processes contain only solid-state diffusion. Solid diffusion is slow, with diffusion coefficients $D_s = 1.E-10$ to $1.E-20$ cm$^2$/sec, 5-16 orders of magnitude smaller than liquid diffusion. Even for the same processing time, the diffusion length is only 3.2 microns to 0.32 A, or several orders of magnitude shorter than our liquid diffusion case.

Because diamond has very high melting point, the ratio of the conventional diffusion temperature to absolute melting point of diamond is very low. The solid diffusion coefficient must be near the lower end, possibly even below. The diffusion is therefore subAngstrom and unmeasurable. My metallizing/brazing/diffusion process for 10 or 20 minutes would require ten or hundreds of years of solid diffusion at the usually used "low" diffusion temperatures to achieve the same diffusion results. Comparatively, then, I have a very fast diffusion source.

Hence, I employ the usual N-type dopants, i.e., elements in the Fifth Group of the Periodic Table such as N, P, As, Sb, Bi, V, Cb, Ta, Pa; elements in the Sixth Group (O, S, Se, Te, Po, Cr, Mo, W, U; and possibly in the Seventh Group (F, Cl, Br, I, At, Mn, Tc. Not only metals such as As, Sb, Bi, W, Mo, . . . , but oxide, nitrides, phosphides, sulfides, phosphates, fluorides, arsenide, arsenates, . . . are useful as N-type dopants in my modified W/Mo-based, combined metallizing/brazing-/contacting/doping process. My W/Mo-based process already contains such N-type dopants as W, Mo, and oxides. To make the doping more effective, multi-doping techniques are used. That is, e.g., oxides of copper, antimony, phosphorous, arsenic fluoride, bismuth phosphates, . . . are used, in combination, as both the braze and multiple dopants. There are other possibilities. Oxygen and nitrogen, for example, form compounds, eutectics, or other phases with many metals and the potential dopants. The potential doping possibilities further explode. The Cu-O phase stability diagram shows that at a given temperature, the partial pressure of oxygen and solubility of oxygen in copper is very low even at our metallizing temperatures. But $Cu_2O$ has much higher partial pressures and apparent source solubility. CuO has even higher solubility, in fact, five orders of magnitude higher at our metallizing temperature. Copper is a key ingredient in our metallize/braze composition. If it is a strong P-type dopant. I can replace it with, e.g., Sb, or As.

I achieve control of the wettability, dopant source concentration, and the properties of diffusion region and metallized interfacial region, as to, e.g., their thicknesses, effectiveness, and properties, by regulating the metallizing compositions, temperatures, and times. Lower metallizing temperatures, higher melting points of the compositions, or shorter processing times give less doping effects and thinner and less diffused interfacial region, and vice versa.

My new method greatly simplifies the diamond bonding method because it: 1) achieves high-temperature thermodynamic equilibrium of component materials, 2) transforms diamond defects into reinforcements, and 3) minimizes static and dynamic mismatch stresses, yielding a vastly superior product.

This proven simplified processing technique combines the metallizing, brazing, contacting, and high-temperature pre-aging or burning-in steps into one operation. The pre-aged or burned-in connections overcome the predominant failure mechanism in diamond electronics due to improper metallization. For diamond active semiconductors, or diamond heat sink applications in electronic circuits, the microscopically perfect wetting and bonding of diamond by metal maximizes contact area, thermal conductivity, and conductance. The single-phase low-modulus or dead-soft annealed braze absorbs mismatch stresses and strains, assuring high thermomechanical shock resistance and uniform, stable carrier mobilities and predictable circuit characteristics.

Other applications of my specially bonded diamond are as follows: High performance missile domes and optical components require ultrahard materials such as sapphire, spinel, or diamond. Such materials are presently fabricated using diamond abrasive grinding and polishing. This process is slow and very expensive and results in substrate subsurface damage, which directly limits optical and rain erosion performance. Extreme chemical, mechanical, thermal, and electronic stability is thus assured.

In the conventional diamond grinding and polishing wheels, the diamond abrasives are not perfectly or defect-freely bonded, as shown above. The defective bonding, as well as defects in the diamond itself, allows the diamond grains to move, deform, vibrate, and fracture erratically and creates random, unwanted modulations of the signals on the programmed finishing forces, positions, and motions. Hence, the finishing process is out of control. Precision finishing is costly, nonreproducible, and even impossible. Lengthened polishing time, rapid tool wear and vibrations, abrasive grain tear-off, and poor surface finish result.

I therefore make special "high-fidelity" (See above) diamond grinding and polishing wheels according to my new diamond bonding technology. The meaning of "high-fidelity" has already been described above. This unique technology produces tenacious, defectfree, thermomechanically shock-resistant, and microscopically perfectly wets and bonds metal layers around the diamond abrasives, eliminating the unwanted modulations of the signals on the programmed finishing forces, positions, and motions. My diamond metallizing process produces the required diamond abrasive coatings on the new grinding and polishing wheels. The process provides perfectly and rigidly braze bonded diamond abrasives layers onto a hard substrate such as carbon or tool steel, or even tungsten carbide. The metallizing liquid seals all crack-initiating surface defects on the diamond film, provides full, rigid metal microsupport for every diamond grain during the polishing operation, and minimizes induced microscopic bending moments and tensile or shear stresses due to the polishing forces. Hence, even under extreme vibrations, heavy loads, or mechanical shocks, the finishing forces and motions are transmitted directly and with high fidelity to the tips of the abrasive grains. Greater finishing accuracy, less diamond wear, chatter, and breakage, and longer wheel life and reliability is therefore possible.

This same method can be used to prepare other high-fidelity machining tools such as those for milling, machining, drilling, and the like, or for ultrahard materials other than diamond such as boron nitride, boron carbide, alumina, silicon carbide, . . . These ultrahard materials can also be surface finished by grinding and polishing wheels made of a still harder ceramic material including diamond.

Most natural diamond and deposited diamond films still contain many defects such as (111) twins, impurities (nitrogen, nickel, iron, alumina, and carbon isotopes), porosities, dislocation, stacking faults, grain boundaries, segregated constituents, inclusions, and unwanted phases (such as carbon). All these defects make the diamond film weak, brittle, and sensitive to mechanical vibrations and shocks. Any microcrack, discontinuity, or impurity particle in the diamond film may initiate localized catastrophic failures. These localized failures degrade the product quality, reduce the finishing speed, and cut short the finishing tool life. Hence, all these defects must be sealed, eliminated, or neutralized. This our proposed coating method will do.

The metallizing/brazing liquid seals microscopic crack-initiating surface porosities and other defects, and produces a single, intimately contacting braze structure. These conditions would ensure rigid support to the diamond abrasives during service but minimum mismatch stresses and stress gradients and maximum toughness, adherence, and thermomechanical shock resistance during use.

Another application of my diamond bonding process relates to poly-crystalline diamond films. These films are grown by plasma enhanced chemical vapor deposition, which offers a means to protect infra-red window and dome materials in severe environments. The deposited diamond have large grain sizes and random crystal orientations which contributes to reduced optical performance because of scatter. Polishing of the growth surfaces is necessary to reduce the scatter effect. However, the large grains and random orientations makes it difficult to polish these films to high qualities at low cost, particularly on large flat or curved surfaces up to two inches in diameter. My metallizing/brazing method gives microscopically perfectly wetting and bonded metallized layers for diamond and provides a tenacious, defect-free, rigid metal (alloys of Cu, Ni, Fe, . . . or even tungsten carbide in cobolt) layer totally embedding all the diamond grains. The metal layer cements together the diamond grains, seals all surface defects, toughens and strengthens the diamond film or layer, firmly microsupports every diamond grains during polishing, and minimizes induced bending moments and tensile or shear stresses on the fragile diamond grains during polishing. Using the same W/Mo-based method, my diamond-carbon steel bonds have exceptional thermomechanical resistance. Even at high temperatures, there will be no peeling, blistering, unwanted chemical reactions, and new phases, for the reasons given above. The bonds withstood heating to (850° C.) and subsequent cooling to room temperature, without apparent damages. This also indicates, as will be shown, high mechanical shock resistance. Our graphite-carbon steel joints withstood 950° C. in slow cooling but 800° C. in rapid quenching into ice water, contrasting 450° C. for similar joints made at Sandia National Laboratories. In addition, these joints can be almost indestructible mechanically when pounded with 12-oz hammers or heavy objects. Our alumina-carbon steel joints withstood 1,000° C. rapid quenching into ice water, while our diamond-copper joints have been tested at 850° C. without failure.

Diamond is transparent to laser. The metallizing/brazing of diamond to metal can be done with pulses of high-intensity $CO_2$ or other laser. The laser beams are transmitted through the diamond without causing much heating, but heat up the metal (steel, Ni, Si, GaAs, . . . ) to form joints of precise sizes at exact locations. The bonding can even be done at below the melting point of a lowmelting substrate because of the localized short laser pulses.

Coated with my metallized/brazed films up to 20 microns thick, ceramics, boron, graphite, diamond, or glass powders 0.5 through 50 to 200 microns in diameters, are also suited for specific particulate reinforced composites. Upon compacting and sintering these metal coated particles to proper densities and mechanical properties, special acoustic or otherwise damping materials are obtained.

Sapphite, quartz, alumina, or zirconia tubes sealed vacuum tightly to niobium, tantalum, or other ceramic tubes make useful electronic cavity or optical windows for services to or over 1300° C. or 1500° C. My bonding method will also avoid the usual frits seals which are weak, contaminating, short-lived, deteriorating to electrooptical characteristics of the component, and otherwise unreliable in operations.

Defect-free or flawless coatings or bondings are also necessary to contain dangerous materials and should be used to replace weldments which almost always have bubbles, oxides inclusions, segregation patterns, severe residual stresses, weak grain boundaries, or other defects.

The strong, defect-free, and thermomechanically shock-resistant quality of the metallized layers on ceramics, graphite, diamond, and reactive metal such as titanium, zirconium, aluminum, or stainless is especially important in the manufacture of advanced composites. Here, the reinforcing fibers, particulates, sheets, or two- or three-dimensional weaves of the ceramics, graphite, boron, oxides of aluminum or zirconium; and carbides or nitrides of Ti, Zr, Hf, V, Nb, Ta, Cr, Mo, or W; borides of carbon or nitrogen; silicides, aluminides, other intermetallics; diamond; and metals are then perfectly not only wetted by, but bonded to, the matrix of metals, ceramics, carbon, borides, nitrides, carbides, diamond, . . . Good interfacial bond strengths in, e.g., about 20 volume % graphite, SiC, or $Si_3N_4$ fibers or particles in Type 6061 aluminum, alumina, or zirconia, allow load transfer to occur between matrix and reinforcing particulates, fibers, or weaves thereby giving maximum specific moduli and strengths. These defect-free bondings at the interfaces prevent debondings and allow ideal load transfer between, within, and along the reinforcing members thereby achieving maximum strength, production yield, and productivity at minimum costs.

By replacing the soft, yieldable braze metal pure copper (with melting point 1083° C.), silver (961.9° C.), gold (1064.4° C.), tin (232.0° C.), zinc (419.6° C.), lead (327.5° C.), antimony (630.5° C.), cadmium (320.9° C.), aluminum (660.4° C.), magnesium (648.8° C.), gallium (29.8° C.), indium (156.4° C.), thallium (303.5° C.), bismuth (271.3° C.), . . . , and their alloys with higher-melting metals such as beryllium, chromium, cobalt, hafnium, iridium; iron, manganese, nickel, niobium, osmium; palladium, platinum, protoactinium, rhenium, rhodium; ruthenium, samarium, scandium, silicon, tantalum; thorium, titanium, uranium, vanadium, yttrium, and zirconium, the allowable operating temperatures of the joints are raised to near their respective melting points of 1278°, 1857°, 1495°, 2227°, 2410°; 1535°, 1244°, 1455°, 2468°, 2700°; 1554°, 1772°, 3000°, 3180°, 1966°; 2310°, 1300°, 1541°, 1430°, 2996°; 1800°, 1660°, 1130°, 1890°, 1522°, and 1852°, Centigrade respectively.

$MoO_3$ or $WO_3$ melts at 801° or 1,550° C., respectively; and is reducible to a Mo or W metallized coating layer on ceramic melting at, and for uses close to, 2,810° or 3,410° C., respectively.

When molybdenum is used as the metallized layer together with an osmium, rhenium, platinum, protoactinium, rhenium, and tantalum braze layer, the melting point of molybdenum, i.e., 2810° C., rather than that of the braze layer, generally limits the useful temperature of the joint. Similarly, when tungsten (melting point 3410° C.) and carbon (melting point 3650° C.) are used as the metallized and brazed layers for more refractory materials, respectively, the lower tungsten melting point dominates. A variety of new, metallized fiber or particulates of, e.g., SiC, $Si_3N_4$, $Al_2O_3$, $ZrO_2$, mulllite, cordierite, diamond, glass, quartz, and other ceramics can thus be produced that can be used as reinforcement in composites for temperatures over 1500°, 2000°, 2500°3000°, or higher.

Matrix-reinforcement chemical reactions are serious problems in composites. In graphite-aluminum composites, for example, the graphite reinforcement may react with matrix aluminum to form brittle aluminum carbide. At a given service, processing, or other operating temperatures over about 800° C. the graphite-aluminum interfacial reactions may thus be intolerable. High-melting metals given above and used as the metallized/brazed layers on the graphite slow down the elemental diffusion rates and, therefore, graphite particulate—or fiber-matrix interfacial reactions. The heavy metals W or Mo and refractory metals slow down even further. This is because the elemental diffusion rates are functions of the ratio of the operating temperature to the absolute melting temperature. At the same operating temperature of, e.g., 550° C., this ratio for aluminum directly contacting graphite is $(550+273.1)/(660.4+273.1) = 0.882$. With nickel braze on the graphite fibers according to my invention, the interfacial reaction is now between nickel and graphite, and the same ratio is reduced to $823.1/(1455+273.1) = 0.476$. When the graphite fibers are metallized with Mo or W, the same ratios are further reduced to 0.267 or 0.223, respectively. With wide available variety of metallizing alloys (e.g., W-Fe, Mo-Mn, Cr-Ni, Cu-Zn, . . . ) and coated layers on ceramic reinforcing fibers and particulates, these ratios can be selectively chosen to be less than, e.g., 0.6, 0.5, 0.4, 0.3, 0.22, or even less. The matrix-reinforcement interfacial chemical reactions are thereby reduced, weakening of composite strength is minimized and embrittlement of reinforcement or destruction of composite avoided.

Interfacial chemical reactivity between, e.g., ceramic reinforcement and the metal matrix, can be further suppressed or totally eliminated by coating the metallized/brazed layer with chromium or aluminum. Chromium, aluminum, and their alloys form adherent, dense oxides that resist further oxygen penetration to, e.g., the underneath graphite fibers. These specially metallized/coated graphite or carbon fibers are thermochemically stable in oxygen or other oxidizing atmospheres.

Even mismatch ceramic-metal joints made according to my invention refused to fail under repeated, rapid and severe thermomechanical shocks. Further, the final forced fractures occur away from the bonding regions. This shows that the bonds are free of flaws, microcracks, inclusions, and other defects. In addition, the bond is actually stronger than the weaker ceramic member. This is because the liquid layer formed on the ceramic surface during the metallizing step, generally from 5 to 50 microns thick, actually seals surface notches and other flaws. The metallizing W/Mo ingredients, as will be shown, also strengthen the ceramic at the interfacial region through solution strengthening, or formation of microcomposite reinforcement in the form of precipitated particulates and reinforcing roots, branches, or networks. In many composites, weight is a critical consideration. A very thin W/Mo-based metallized/brazed layer, down to several atomic layers in thickness, may be used with or without any copper, nickel, or other braze metal. The formation of a surface liquid diffusion layer 3 to 30 atomic layers (about 10 to 100 A), takes only 10E-9 to 10E-7 seconds, if a liquid diffusion coefficient of 10E-5 cm×cm/sec is used. The control of such extremely thin layer can still be achieved by applying a thin layer of the metallizing solution containing the appropriate amount of molybdate or tungstate compounds.

Another problem with composites is that ceramic, graphite, and carbon fibers are very difficult to be perfectly wetted by, or bonded to, metals, other ceramics, or even to epoxy. Because of this difficulty, an airplane or other vehicle made of these composites often structurally fails under cyclic environmental heat-moisture conditions. Under capillary attraction forces, rain or condensed moisture on the composite surface deeply penetrates, or is sucked in, along the tiny passageways in the unbonded or poorly bonded interfacial regions between the graphite or other ceramic fibers and the epoxy, metal, or ceramic matrices. This penetration is facilitated by air release in, for example, an improperly oriented one-dimensional reinforcement where water enters from the outside skin and move freely along the entire length of the fibers, with entrapped air being forced to leave out of the inner surfaces. This fills the composite structure with water. When the environment turns cold, the filled water expands on freezing, disruptively enlarging the passageways and further debonding the reinforcement from the matrices. Repeated filling-expanding cycles may destroy the composites. When a high-altitude airplane lands in a hot humid weather, moisture automatically condensed onto the very cold composite skin and similarly fill the passageways. The vehicle may take off again into the same freezing attitude where the filled water also expands on freezing with disruptive forces. Multiple cycles of landing and high-altitude flying also destroy the composite.

Figure 2A:
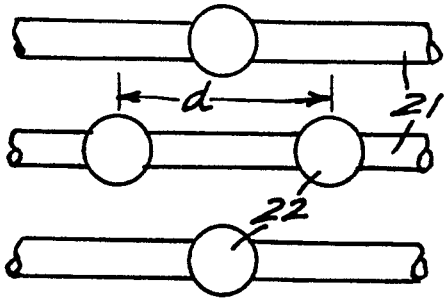
FIGS. 2a and 2b show nodular bonding spots on reinforcing carbon fibers in carbon composites.
Figure 2B:
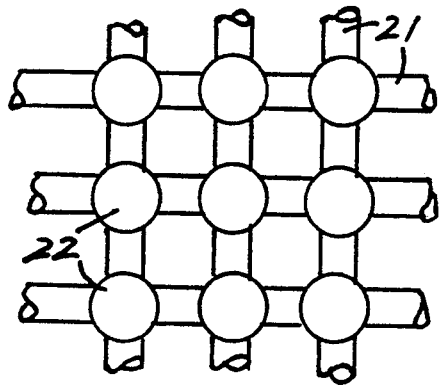

By uniformly covering these fibers with flawless metallized W/Mo-based coatings, with or without brazing materials, the bonding between these coatings and the matrix will also be flawless. Water penetration is then impossible. Periodic coating of all the strands of these fibers 21 along their lengths with nodular metallized spots 22 at a specific distance d apart breaks up the passageways into small compartments of length d (FIG. 2a). Water can now penetrate to no more than the same distance d below the composite surface. Dipping a two-dimensional or three-dimensional fiber weave into a W/Mo-based metallizing solution or paste, again with or without braze, preferentially coats only the intersections of the fibers with the metallizing compound to thereby form the required nodules for stopping deep water penetration (FIG. 2b). The size of the nodular metallized spots can be controlled by adjusting the viscosity and/or solid content of the solution or paste. Wetting control with the addition of acetone, alcohol, house detergent (e.g., Wisk) also helps.

The reinforcing graphite or other ceramic fibers selectively but perfectly bonded at the nodulated or coated spots in the composites achieve excellent load transfer between fibers, or even along the fibers in metal-matrix composites, but allow systematically and controlably unbonded or weakly bonded regions between the nodules, lending to excellent toughness as well as heat and shock resistances.

The ceramic metallizing processes described in this invention also allow the brazing or coating of the internal or external surfaces of ceramics of controlled densities or porosities. More specifically, porous alumina, zirconia, silicon carbide, mullite, and cordierite have already been metallized on either the internal pores, external surfaces, or both. Substantially 100% of the internal surfaces of the porous ceramic can be metallized by my processes. Ceramic filters for, for example, molten steel, aluminum, or other metals or materials are already in wide uses. But the difficulty of perfectly bonding these weak and porous filter ceramic medium to each other or to metals make their uses difficult, tricky, unreliable, and often dangerous. By bonding these ceramic filters to steel wires or plates, as I have done, these handling problems are minimized.

Multi-stage ceramic filters of alumina, zirconia, silicon carbide, yttria, mullite, cordierite, glass, or other ceramics strongly bonded to the same or different ceramic of the same or increasingly finer pore sizes can now be joined together, one on top of the other. Metal-reinforced multi-stage filters can also be made for, e.g., added strength through metal strengthening; multiple-purpose separations of gases, liquids, or solids from one another through physical means due to size differences; absorption by carbon; catalytic reactions by platinum; liberation or desorption of gases such as oxygen, nitrogen, carbon oxides, or hydrogen from the bonded oxides, nitrides, carbide; hydride for doping or addition to the molten metals or other materials; separation of substances of the same gas, liquid, or solid phases; and other special features functions.

Ceramic filters for air, gas, oil, transmission fluids, and cooling water on automobiles, diesels, power generating equipment, and other machineries are already available. Similar filters for various other fluids including molten metals such as steel or aluminum, or catalytic reactors can, with my bonding method, be strongly attached to internal or external carbon steel or stainless steel containers, other metallic, carbon, or ceramic hooks, knobs, holders, fasteners, protrusions, strengtheners, friction contacts, or springy devices for easy handling or to form fluid-tight enclosures without fluid by-passings.

Catalytic materials such as platinum alloys may also be coated on the metallized layer via diffusion coating, brazing, electrolytic or electroless plating. Reactive materials such as yttria or CaO can also be made porous by sol gel, or by controlled powder packing and sintering, to achieve any desired powder sizes and packing or sintered densities. Such reactive ceramic filters, properly bonded to metal structures, may be used, for example, to remove weakening sulfur in high-quality tool steel poured through these filters.

An electric heater may surround, or be embedded in, the porous ceramic filter for periodical activation with electric ohmic heating to burn to ashes or gases the materials remaining on the ceramic filtering medium. This achieves reusable or self-cleaning results.

Many other uses in differing industries of my bonding methods are readily seen. These include ceramic composites, graphite composites, intermetallic composites, metal-matrix composites, coatings on ceramics, graphite, or metals, high-strength chemically bonded ceramics, and self-lubricating materials containing, e.g., lubricating talc, $MoS_2$, or graphite particles in iron, steel, copper, or nickel. The composites may involve reinforcing fibers or particulates of ceramics, intermetallics, graphite, or metals in a matrix of ceramic, intermetallic, graphite, or metal.

Using my metallizing methods described above, metallized refractory metallic compounds can be formed for uses as the matrix or reinforcement for composites. These compounds include: oxides of Al, Ba, Be, Ca, Cr, Eu, Gd, La, Mg, Ni, Pu, Ru, Sm, Sc, Si, Th, Ti, U, V, Y, and Zr; carbides of Al, B, Ba, Be, Ca, Hf, Mo, Nb, Si, Ta, Th, Ti, U, V, W, and Zr; borides of Ba, Ca, Ce, Hf, Mo, Ni, Sr, Ta, Th, Ti, U, V, and Zr; Sulfides of Ca, Gd, Sr, U, and Y; nitrides of Al, Hf, La, Nb, Nd, Sc, Si, Pr, Pu, Ta, Th, Ti, U, V, Y, and Zr; and aluminides of Fe, Ni, Pt, Be, and Ti. Particularly attractive among these compounds are: $Si_3N_4$, SiAlON, SiC, $Al_2O_3$, mullite, AlN, $B_4C$, $TiB_2$, and BN.

Light, strong, tough, and reliable structural Al, Mg, Be, Ti alloys in composite forms can thus be made with metallized graphite, SiC, or other ceramic reinforcement that will operate over 480° C.

Powders of a ceramic, carbon, intermetallics, or reactive metal may be similarly metallized to achieve flawless and perfectly wetting surface characteristics so that the sintered powder compacts or liquid metal infiltrated composites will form that have unusually high strengths, densities, and thermal conductivities. Such metallized powders can also be cast as particulate reinforcements or strengtheners. These same powders can be cast (by, e.g., hot squeeze method) to achieve near net shape or net shape into complex structures or components.

Figure 3B:
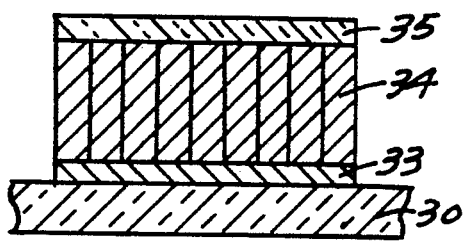
FIGS. 3a and 3b show a multi-purpose bonding method for high temperature ceramic superconductors.
Figure 3A:
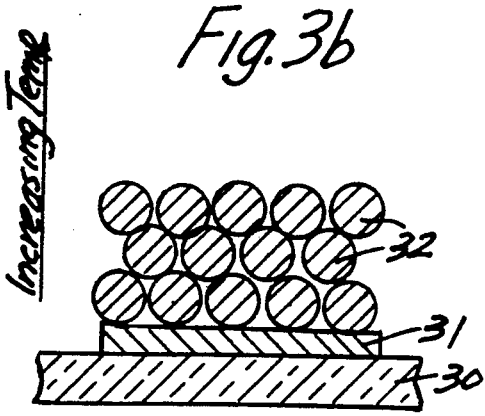

A multi-purpose procedure for bonding, sintering, purifying, densifying, strengthening, and otherwise improving the high temperature 123 ceramic superconductor is shown in FIG. 3. High temperature superconductors are superconductors which superconducts at above 90 degrees K. (Kelvin). In this multi-purpose procedure, a layer of a suitable $MoO_3$-based mixture 31 is formed at selected spots on the copper substrate 30, as shown in FIG. 3a. This sintering-aiding composition or mixture aids in the sintering of the superconductor powders at the processing temperatures. $MoO_3$ is the key ingredient in many Mo-based metallizing operations. It melts at 801° C., but the melting point can be lowered or raised to selectable temperatures by forming eutectics or compound with, e.g., CuO, BaO, and $Y_2O_3$, and other oxides such as AgO, CaO, or TlO (Thallium oxide), or even fluorides, chlorides, or iodides in view of Ovshinsky's promising results on superconducting and particularly current-carrying capabilities. Upon this MoO$_3$-based layer is spread the YBa$_2$Cu$_3$O$_{7-x}$ powders 32. A vertical temperature gradient is applied to the composite so that the top of the superconductor powders is at least 20° to 50° C. below its melting point, while the bottom of the MoO$_3$-based layer is above the melting point of this mixture. This mixture layer will melt and sweep upward (FIG. 3a) to achieve the following highly desirable results:

1. Metallizing and bonding of the bottom layer of 123 superconductor to the copper substrate;
2. Temperature gradient zone-melting to purify the superconductor boundaries according to Pfann (See: Zone Melting, Wiley, 1966);
3. Vertically oriented, upward columnar grain growth 34;
4. grain boundary scavenging, oxgenation, or halogen doping;
5. Liquid phase sintering of the superconductor particles for improved sintering speed, density, mechanical strength, and material stabilities partly also due to the purified or doped grain boundaries;
6. High critical current density of the purified, thinner, and oriented grain boundaries;
7. Cushioning or shock-absorbing qualities of the liquid-diffused, chemically and mechanically graded interfacial layer 33 between the superconductor film and substrate; and
8. Simple, low-cost, single-step and mass-producing but potentially high-yielding film-making operation.

After this special temperature-gradient multi-purpose operation, most of the impurities will be dissolved in the sweeping zone. This zone eventually comes up to the surface to be frozen into a highly impure layer 35. This impure layer can be removed by, e.g., grinding or chemical etching with mineral acids. See FIG. 3b.

Other high-temperature ceramic superconductors such as Tl$_2$Ba$_2$Ca$_2$Cu$_3$O$_{10}$ and TlCa$_2$Ba$_3$Cu$_4$O$_x$ can be similarly bonded or treated for properties improvement with the above method. The substrate does not have to be pure copper, but can be other metals such as aluminum, nickel, or iron, glasses, graphite, or diamond. In addition, other ceramics such as Al2O3, ZrO2, SiC, carbon, glasses, diamond, or even metals powders or filaments, may be similarly bonded onto metallic, ceramic, glass, or carbon substrates. The ceramic layer 34 with thinned, purified, oriented grain boundaries have improved physicochemical properties including thermal and electrical conductivities since grain boundaries are well-known to contribute to resistivity.

Low current density in high T$_c$ ceramic superconductors is still a major problem, particularly in polycrystalline, bulk or thick film materials. Improper grain boundaries are mostly responsible. My special multi-purpose bonding method overcomes this problem.

In ceramic-metal joints other than for superconductor application, however, the above zone-melting procedure is harmful from the bond strength viewpoint. This is because the last-solidifying layer, usually of complex ceramic eutectic compounds, is weak and brittle and reduces the joint strength. The proper cooling direction after the metallizing here should, therefore, not be vertical but horizontal. In this way the last-forming layer is laterally swept out of the joint region without harmfully affecting the joint strength.

According to the above disclosures, I microengineer the ceramic-metal, ceramic-metallizing layer, and/or metallizing-braze layers by substantial thickness and, more important, graded composition, thermoconductivity, and mechanical properties. The W/Mo-based metallized layer may be, for example, 10 to 20 or 30 microns containing a graded interfacial layer up to 5 or 10 microns. The effective liquid diffusion length described above may range from 5 to the entire 30 microns. These layers are obtained by liquid diffusion, generally over five minutes but up to one hour. The Cu, Ni, or alloy braze layers may also be chemically, mechanical, and physically graded, as described above.

Figure 4A:
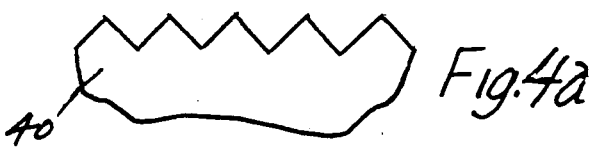
FIGS. 4a, 4b, 4c and 4d shows newly microengineered microstructures of the bonding interfacial regions.
Figure 4B:
Figure 4C:
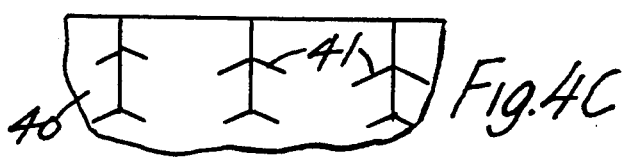
Figure 4D:
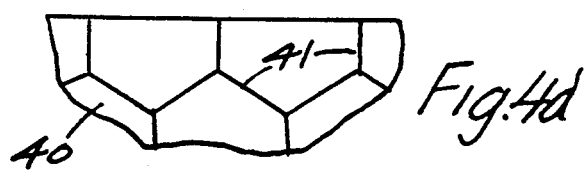

Another important grading of the interfacial layer relates to the microstructure. Many conventional joints rely on superficial adhesion, weak and defective chemical bonding, or mechanical anchoring with roughened surfaces. Rough surfaces increase surface area by about 41.4% with 45-degree slopes or valleys (FIG. 4a). An important feature of my invention is the principle of rooting (FIG. 4b), branching (FIG. 4c), and networking (FIG. 4d). Straight roots of the metallizing materials 41 penetrate, during the metallizing or rapid liquid diffusion period, deep along the ceramic grain boundaries 40. These roots may be in the form of fibers located at the intersections of the multiple boundaries, or in the form of sheets each located between two adjacent ceramic grains. These fibers and sheets may be straight, extending generally perpendicularly to the ceramic-metal interface (FIG. 4a). They may form branches following the grain boundaries (FIG. 4b). These roots may even flow deeply into the grain boundaries and turn or curve around to form a partial or complete network (FIG. 4c). The formation of these fibers or sheets depend on the surface energies of the metallizing compounds relative to those of the ceramic grains at the metallizing temperature. The depth of penetration also depends on these energies, but primarily on the metallizing temperature and time.

Preferably, these penetrating metallizing material form reinforcement in a matrix of the ceramic material at the interfacial region. This can be achieved by selecting a W/Mo-based metallizing composition which, with the ceramic at the metallizing temperature, forms hard (Mohr hardness over 8 or 9 versus less than 7 or 6 for the matrix), tough, and strong compounds. Useful compounds include PbMoO$_4$, MgWO$_4$, CaMoO$_4$, MnWO$_4$, and the like. In practice, I simply use pure starting materials such as MoO3, WO3, PbO, CaO, . . . , prepare the exact or near stoichiometric compositions for the metallizing compositions, and metallize at a temperature 50° to 200° C. above the melting points of these compounds. By varying the metallizing time, the grain-boundary reinforcing compounds penetrate to different depths, according to the square root of time diffusion law. For example, for a liquid diffusion case with a diffusion coefficient of 10E−5 cm×cm/sec, metallizing for 5 to 60 minutes gives a diffusion length or penetration depth of about 0.055 to 0.19 cm. The required liquid metallizing times are 30.2 and 361, respectively, if a liquid diffusion coefficient of $10^{-4}$ cm$^2$/sec is used. As shown previously, the liquid diffusion coefficient is in the range of $10^{-5}$ to $10^{-4}$ cm$^2$/sec. The diffusion length or penetration depth equals the square root of the product of the diffusion coefficient and processing time. If the liquid diffusion coefficient is reduced tenfold from $10^{-4}$ to $10^{-5}$ cm$^2$/sec, the processing time for the same product or diffusion length of 0.055 to 0.19 cm must also be increased tenfold, i.e., 302 to 3,610 sec. I also achieved moderately different penetrations of reinforcing particles, fibers, or sheets of different penetration depths by changing the metallizing compositions, e.g., from the W-based type to the Mo-based type.

Figure 9A:
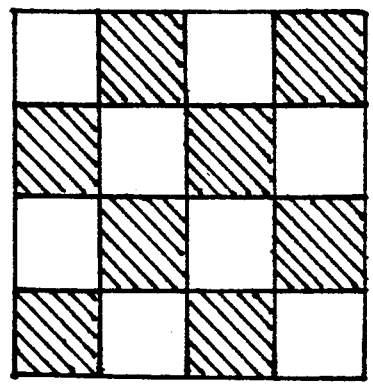
FIGS. 9(a) and 9(b) show a method of overcoming mismatch stresses on long or large-area coatings or joints.
Figure 9B:
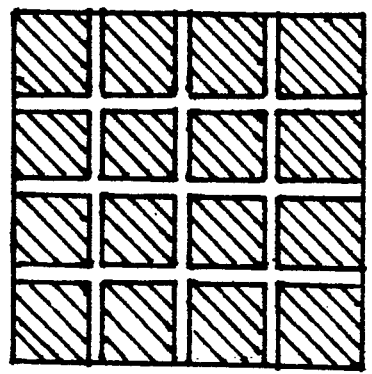

FIG. 9 shows a method of making large size ceramic coatings on another material or ceramic-bonded joints. The principle is to break the large area, or length for a one-dimensional object such as a rod, into many segments so that each segment is of such a small area or length that the mismatch stresses or strains are tolerable by the ceramic. The bonded areas are represented by the white or hatched squares in the chess-board pattern of FIG. 9a. This joint or coating in FIG. 9a is even vacuum-tight because the corners of the many small squares are connected and gas or vacuum-tight. FIG. 9b shows another method of making large ceramic coatings or joints. The bonded areas may be the hatched squares, in which case, one side of the joint or coat is fluid communicable with the other side. Alternately, the bonded areas may be the white grid pattern between the squares left by the hatched squares, in which case the joint or coating is again vacuum, gas, or liquid-tight as in the joint or coating of FIG. 9a.

The metallized layer has low viscosity, and wets the ceramic with a wetting angle of less than 15° or 5°. Preferably, this angle is close to 0°, perfect or nearly perfect wetting then occurs. This metallizing liquid will wet not only the top surface, but also any surface pores, microcracks, and other defects, transforming these crack-initiating defects into useful reinforcements. In fact, microcomposite bonding region forms, toughening and strengthening the ceramic bonding surface.

The top surfaces of the metallized parts shown in FIG. 4a–4d have metallized layers whose chemical compositions are the same, or nearly the same, as those of the roots, branches, or networks 41. Since this metal composition have higher coefficients of thermal expansion than the ceramic 40, mismatch stresses arise on cooling from the high metallizing temperature to room or service temperature. Specifically, the more shrinking, top metal layers will be under tension, compressing and further toughening and strengthening the ceramics 40. Comparable to the distance between two neighboring roots, branches, or network boundaries, the length or depth of the roots or branches may be from 2 to 200 microns, while the networks may even extend deeper. That is, a ceramic surface region from 0 to over 200 microns are thus toughened and strengthened through the compression applied by the more shrinking metal layer on the top surface of the metallized ceramics 40.

Active metals, such as Ti, Zr, Pt, and Nb, and their alloys, with or without other metals such as Ni and Cu, are also useful metallizing materials. But these active metals require pure metals, not oxides, carbonates, . . . With oxygen, the active metals form stable oxides, which are difficult to bond or metallize. Under non-oxidizing conditions, and at processing temperatures sufficiently (50°–400° C.) above their melting points to decrease their viscosity, these active metals in molten form can also wet easily on most ceramics, have small wetting angles under good vacuum and, therefore, not only metallize and bond, but also penetrate to from roots, branches, and networks, just like my W/Mo-based metallizing compositions. Some of their compounds, such as titanates, zirconates, or other oxygen compounds of these active metals with Ca, Mg, Sr, and Ba, are also very hard and strong (at least 10%, preferably 20% harder in Vicker's hardness and/or stronger in tensile strength than the ceramic), and thus form good reinforcements for the microcomposite bonding regions.

Because of the many benefits of my inventions, the ceramic metallized coatings and metal-ceramic bonds are thermally stable and useful at high service or use temperatures, e.g., above 630° C. At these high temperatures, the ceramic coatings or bonds of this invention not only remain solid, but are useful and can carry nominal external loads. Even loads higher than the ceramic's nominal strengths are likely because of the microcomposite and favorable residual stress formations, surface sealing, toughening, and strengthening, and many other techniques described above. By comparison, conventional ceramic coatings contain weak and unstable phases, or become molten, partially molten, or viscous, and cannot, therefore, carry any meaningful external load. The common ceramic-metal joints fail for similar reasons at high temperatures.

Thus, with my new ceramic-ceramic or ceramic-metal joining methods, new structure joints, coatings, or surface can be produced that have wide uses due to their hardnesses (diamond, alumina, zirconia), hardness and resistances to wear (diamond, zirconia) or corrosion (diamond, carbon, alumina), electrical or thermal conductivity/insulation (zirconia, beryllia, diamond, silver, stainless steel), catalytic activity (platinum), and other properties or appearances.

Tool bits of silicon carbide or nitride, alumina, diamond, and other cutting or abrasive materials can, for example, be metallized with my methods and joined to steel holders to form cutting, drilling, milling, or other machining tools. Particles of the same materials, mixed with the W/Mo metallizing compounds together with copper or nickel brazing alloys, can be spread onto inexpensive carbon steel sheets 0.010 to 0.250 mils thick. Upon heating in a reducing temperature, a steel sanding sheet or block is formed. The braze metal may be very thin and merely joins the abrasive particles to the steel plate. The same braze metal may have a thickness up to 95% of the size of the particles, to support sully and hold strongly these particles while still allowing their sharp cutting edges to perform.

Figure 5:
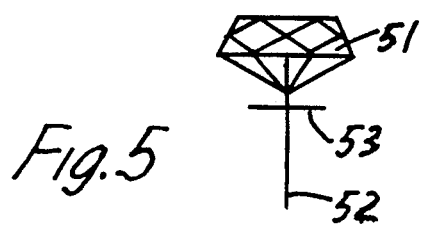
FIG. 5 shows a bonding method for mounting diamond or other gem stones.

Gem stones such as diamond, sapphire, quartz, and the like can be mounted onto metal holders. Because of the excellent strength of the bond, minimum contact with holding metals is needed. As shown in FIG. 5, diamond 51 can now be mounted on the tip of a fine wire 52 so that practically its entire back surface can be illuminated. Also, different back characteristics (color, texture, and reflectivity) can now be instantly changed.

The invention, as described above, is not to be construed as limited to the particular forms disclosed therein, since these are to be regarded as illustrative rather than restrictive. Various combinations, equivalent substitutions, or other modifications of the preferred embodiments described herein are obviously possible in light of the description, without departing from the spirit of the invention. In particular, other ceramics such as alumina or zirconia may be used instead of MACOR with the same or a modified metallizing composition. Accordingly, the invention is to be limited only as indicated by the scope of the following appended claims:

I claim:

1. A method for coating a ceramic with a thermally stable, metallized coating layer which, in its solid form, is capable of being used over 630° C., comprising:

selecting a ceramic metallizing composition having a plurality of mixed powdered metallizing ingredients of differing sizes and suspended in a common fluid suspension medium, said composition when molten causing reactions between the ingredients and also with the ceramic to form the metallized coating layer on the ceramic;

preparing the metallizing composition by proportioning the differing sizes of the mixed ingredients so that the final settling velocities of the mixed powders in said medium are nearly the same;

coating onto a selected surface of the ceramic a layer of the metallizing composition;

heating the coated ceramic surface to a first temperature at which the metallizing composition metals to cause said reactions between the ingredients and with the ceramic thereby achieving ceramic metallization; and keeping the composition molten for a sufficiently long time to thereby form on the ceramic by liquid diffusion the thermally stable, metallized coating layer.

2. A method as in claim 1 wherein the metallizing composition comprises a metal selected from the group consisting of W and Mo; and comprising providing a metallic layer at least five microns in thickness onto the metallized coating layer.

3. A method as in claim 2 wherein said metallic layer comprises a metal selected from the group consisting of Cu, Au, Ag, Ni, Fe, Co, Al, Mg, Ga, In, Pb, Sn, Zn, Sb, and Bi.

4. A method as in claim 1 for application with carbon fibers, each fiber having a plurality of strands, and wherein said coating, heating, and keeping steps comprise coating each strand of every fiber with the metallizing composition and forming nodular metallized spots along the length of each fiber at a periodic distance apart.

5. A method as in claim 1 for metallizing the ceramic wherein said coating step comprises coating the selected surface of the ceramic with the coated layer of the metallizing composition comprising an element selected from the group consisting of tungsten and molybdenum; and said heating and keeping steps comprise keeping the coated ceramic heated for at least five minutes at temperature at least 50° C. above the first temperature to thereby form the thermally stable, metallized coating layer on the ceramic.

6. A method as in claim 5 wherein said ceramic is a material selected from the group consisting of diamond and graphite and wherein said heating and keeping steps are done in an atmosphere selected to minimize the loss of carbon from the ceramic.

7. A method as in claim 5 for metallizing graphite and wherein said coating, heating, and keeping steps comprise providing the ceramic with the thermally stable, metallized coating layer comprising a metal selected from the group consisting of Cu, Ag, Au, Sn, Zn, Pb, Sb, Cd, Al, Mg, Ga, In, Th, Bi, Cr, Co, Fe, Mn, Ni, Nb, Pt, Pd, Rh, Ir, Os, and Ru; and comprising the additional step of providing the thus coated surface with an ambient-resistant, top surface metal layer at least 100 Å thick.

8. A method as in claim 5 for use in forming a powder metallurgy product with powders selected from the group consisting of ceramics, boron, graphite, diamond, and glass in the range of 0.5 to 200 microns in diameter and wherein said heating and keeping steps comprise providing the metallized coating layer of up to 20 microns thick on each powder, an comprising the additional step of compacting and sintering the thus surface-metallized powders.

9. A method as in claim 5 for use in a ceramic fiber-reinforced composite subjected to cyclic environmental heat-moisture conditions and wherein said coating step comprises periodically coating all strands of the ceramic fibers along their lengths with nodular metallized spots at a periodic distance apart to break up the moisture passageways into compartments between the nodular metallized spots.

10. A method as in claim 9 wherein said ceramic fibers are in the form of multi-dimensional weave and comprising:

providing the metallizing composition in a liquid or paste form;

dipping the multi-dimensional ceramic fiber weave into the metallizing liquid or paste composition to preferentially coat only the intersections of the fibers with the metallizing composition to thereby form the nodular metallized spots; and controlling the size of the nodular metallized spots by adjusting at least one parameter of the metallizing liquid or paste composition selected from the group consisting of viscosity, solid content, and wettability of the composition.

11. A method as in claim 5 wherein said ceramic is a porous ceramic of controlled density or porosity and wherein said coating, heating, and keeping steps comprise coating and metallizing the entire internal surface of all the pores in the porous ceramic.

12. A method as in claim 1 wherein said selecting step comprises selecting the ceramic metallizing composition to consist of two metallizing ingredients; and comprising the additional step of providing one of the ingredients in a solution form while supplying the other ingredient in powders of a single substance suspended in said solution.

13. A method as in claim 1 wherein said selecting step comprises selecting the ceramic metallizing composition to consist of at least two metallizing ingredients; and comprising the addition step of integrating the at least two ingredients into a physically inseparable form.

14. A method as in claim 1 wherein said selecting step comprises selecting the ceramic metallizing composition having two powdered ingredients, with subscripts 1 and 2, of densities and sizes $d_1$ and $D_1$, and $d_2$ and $D_2$, respectively, $d_1$ and $D_2$ being respectively greater than $d_2$ and $D_1$, both powders being suspended in the common suspension medium of density $d_m$, and comparing the additional step of selecting the ratio of the powder sizes $D_2/D_1$ to be at least equal to the square root of $(d_1-d_m)/(d_2-d_m)$.

15. A method as in claim 1 wherein said selecting step comprises selecting the ceramic metallizing composition having a plurality of n powdered ingredients of densities and sizes $d_1$ and $D_1$, $d_2$ and $D_2$, ..., $d_i$ and $D_i$, ..., $d_n$ and $D_n$, respectively, all powders being suspended in the common suspension medium of density $d_m$, and comprising the addition step of selecting the powder sizes $D_1, D_2, ..., D_i, ..., D_n$, to make the $D_i^2*(d_1-d_m)$ nearly constant.

16. A method as in claim 1 wherein said ceramic is to be mounted on a holder and wherein said coating step comprises coating only a single point on the ceramic while the heating and keeping steps comprises providing the metallized coating layer on the ceramic at the single coated point for bonding thereat to the holder.

17. A method as in claim 16 wherein said ceramic is a gem stone selected from the group consisting of diamond, sapphire, and quartz.

18. A method as in claim 1 wherein said metallizing composition melts at the first temperature to wet the ceramic with a wetting angle of less than 5 degrees.

19. A method of strengthening the surface of a ceramic with a metallized coating layer, said layer in its solid form being useful over about 630° C., comprising:
preparing a ceramic metallizing composition which, when heated within a temperature range of at least 10° C. above its melting point but not to so a high temperature as to damage the ceramic, is wettable and capable of penetrating in the ceramic surface region relative to the surface defects contained therein;
coating the metallizing composition onto a selected surface of the ceramic;
heating the coated ceramic to a metallizing temperature within the above-specified temperature region; and
keeping the coated ceramic thus heated for a sufficiently long time so that the molten metallizing composition penetrates into, wets, and seals the surface defects in the coated ceramic surface region.

20. A method as in claim 19 comprising the additional step of additionally strengthening the ceramic surface region through formation in the ceramic of microcomposite reinforcement in the form of precipitated particulates, reinforcing roots, branches, or networks.

21. A method as in claim 19 comprising the additional step of adding onto the metallized coating layer a metal layer over 100 microns thick to further toughen the ceramic.

22. A method as in claim 19 wherein the penetrating metallizing composition additionally forms microscopic reinforcement in a matrix of the ceramic material in the ceramic surface region.

23. A method as in claim 19 wherein said preparing step comprises selecting a composition as the metallizing composition which, with the ceramic at the metallizing temperature, forms a reinforcing substance for the ceramic.

24. A method as in claim 23 wherein said selecting step comprises selecting a composition as the metallizing composition which forms, at the metallizing temperature, the reinforcing substance having a Mohr hardness of at least 8.

25. A method as in claim 23 wherein said selecting step comprises selecting a composition as the metallizing composition which forms the reinforcing substance with the ceramic at the metallizing temperature,
said reinforcing substance, being in liquid form and capable of penetrating in the ceramic, forming fibers of the reinforcing substance located at the intersections of the multiple ceramic grain boundaries.

26. A method as in claim 23 wherein said selecting step comprises selecting a composition as the metallizing composition which forms the reinforcing substance with the ceramic at the metallizing temperature, said reinforcing substance penetrating into the ceramic to form a sheet of the reinforcing substance located along the boundary between two neighboring ceramic grains.

27. A method as in claim 23 wherein said selecting step comprises selecting a composition as the metallizing composition which forms the reinforcing substance with the ceramic at the metallizing temperature, said reinforcing substance penetrating into the ceramic to form branches following the ceramic grain boundaries.

28. A method as in claim 23 wherein said selecting step comprises selecting a composition as the metallizing composition which forms the reinforcing substance with the ceramic at the metallizing temperature, said reinforcing substance alloying into the ceramic forming precipitated reinforcing particles inside the ceramic grains.

29. A method as in claim 23 wherein said selecting step comprises selecting a composition as the metallizing composition which forms the reinforcing substance with the ceramic at the metallizing temperature, said reinforcing substance penetrating into the ceramic to form roots which flow into the grain boundaries and turn or curve around to form at least a partial network of the reinforcing substance around a multitude of the ceramic grains.

30. A method as in claim 25 wherein said selecting step comprises selecting a metallizing composition comprising a metal selected from the group consisting of W and Mo, said metallizing composition forming, at the metallizing temperature, the reinforcing substance in the form of a reinforcing compound comprising said metal, and comprising:
preparing the metallizing composition at or near the exact stoichiometric compositions for the reinforcing compound;
metallizing at a temperature at least 50° C. above the melting point of the reinforcing compound; and
varying the metallizing time from five minutes up to allow the molten reinforcing compound to penetrate to a depth of a fractional millimeter.

31. A method as in claim 19 wherein said ceramic metallizing composition comprises a metal selected from the group consisting of W, Mo, Ti, and Zr.

32. A method as in claim 19 for forming the metallized coating layer over an area of the ceramic surface and comprising the additional step of dividing according to a selected geometrical pattern the area of the metallized coating layer into a plurality of smaller areas such that the mismatch stresses between the metallized coating layer and the ceramic surface in each of said smaller areas is insufficient to degrade the coated ceramic.

33. A method as in claim 32 wherein said dividing step comprises dividing the area of the metallized coating layer into the smaller areas according to a selected grid pattern.

34. A method as in claim 19 wherein said metallizing composition melts at the metallizing temperature to wet the ceramic with a wetting angle of less than 5 degrees.

35. A method as in claim 19 wherein said metallizing composition melts at the metallizing temperature to wet the ceramic with a wetting angle of close to zero degrees.

36. A method for coating a densified ceramic layer onto a substrate, comprising:
supplying the substrate onto which the densified ceramic layer is to be coated;

providing a layer of a ceramic-sintering aiding composition on the substrate, said composition at a sintering temperature being capable of aiding in the sintering of the ceramic grains in an undensified ceramic layer together into densified form and simultaneously of coating the densified ceramic layer onto the substrate;

providing the undensified ceramic layer onto the ceramic-sintering aiding composition layer;

applying at the substrate surface a first temperature at least about 50° C. above the melting point of the ceramic-sintering aiding composition; and applying onto the top surface of the undensified ceramic layer a second temperature which is above both the first temperature and the sintering temperature of the ceramic so as to form a temperature gradient across the undensified ceramic layer to cause the sintering of the ceramic grains in the undensified ceramic layer and the regrowth of densified ceramic grains;

the first and second temperatures being sufficiently high to form a liquid layer of the ceramic-sintering aiding composition, said liquid layer sweeping under the influence of the temperature gradient across the sintering ceramic layer from the substrate upward and carrying therewith undesirable impurities in the ceramic so as to purify, densify, and strengthen the ceramic layer, and to orient generally normally of the substrate surface or along the temperature gradient the sintered and regrown ceramic grains in columnar forms.

37. A method as in claim 36 wherein said two applying steps comprises sintering, purifying, densifying, and strengthening the ceramic layer for improving at least a physicochemical property of the sintered ceramic layer.

38. A method as in claim 37 wherein said physicochemical property is the electrical conductivity of the resultant ceramic layer.

39. A method as in claim 36 wherein said providing step for the ceramic-sintering aiding composition comprises providing at selected areas on the substrate a layer of a mixture comprising a metal selected from the group consisting of W and Mo.

40. A method as in claim 39 wherein said providing step for the ceramic-sintering aiding composition comprises providing, at the selected areas on the substrate, a layer of the ceramic-sintering aiding composition comprising $MoO_3$.

41. A method as in claim 40 wherein said two applying steps comprise applying at the bottom of the $MoO_3$-containing layer the first temperature which is above the melting point of the $MoO_3$-containing layer while simultaneously applying on the top surface of the undensified ceramic layer the second temperature which is at least 20° C. below the melting point of the ceramic, thereby causing the $MoO_3$-containing layer to melt and sweep upward.

42. A method as in claim 36 wherein said two applying steps comprise causing at least most of the impurities in the ceramic to be dissolved in the upward sweeping liquid layer, said liquid layer eventually coming up to the surface of the densified ceramic layer to be frozen into an impure material layer.

43. A method as in claim 48 comprising the additional step of removing the impure material layer swept up on top of the ceramic layer.

44. A method as in claim 36 wherein said ceramic comprises a substance selected from the group consisting of $Al_2O_3$, $ZrO_2$, $Y_2O_3$, BaO, CuO, TlO, CaO, SiC, carbon, glasses, and diamond.

45. A method of coating a ceramic with a refractory metal which in solid form is capable of being used over about 630° C. comprising:

selecting a metallizing composition comprising a metallizing compound which comprises a refractory metal, said compound at a first temperature being reducible to the corresponding metal when the metallizing composition melts at a second temperature;

said metal having a melting point at a third temperature which is above the second temperature;

preparing the metallizing composition;

coating the metallizing composition onto a selected portion of the ceramic surface;

maintaining a reducing environment around the coated ceramic surface; and heating the coating ceramic surface to melt the metallizing composition and to reduce the metallizing compound to the metal to thereby form on the ceramic surface a refractory metallized layer which, in solid form, is capable of being used above the second temperature but below the third temperatures.

46. A method as in claim 45 wherein said metal is selected from the group consisting of W, Mo, Ti, and Zr.

47. A method as in claim 45 comprising laterally cooling, outward from the central area of the coated portion, the molten metallizing composition layer to cause it to sweep the impurities therein laterally outward from the central area.

48. A method as in claim 45 wherein said selecting step comprises selecting $MoO_3$ as the metallizing compound and said heating step comprises heating to above about 801° C. both to melt the $MoO_3$ and to reduce it to Mo so that the metallized ceramic is thereby useful above 801° C. but below the melting points of both the ceramic and the Mo at 2,810° C.

49. A method as in claim 45 wherein said selecting step comprises selecting $WO_3$ as the metallizing compound and said heating step comprises heating to above about 1,550° C. both to melt the $WO_3$ and to reduce it to W so that the metallized ceramic is thereby useful above about 1,550° C. but below the melting points of both the ceramic and the W at 3410° C.

* * * * *